(12) United States Patent
Mori et al.

(10) Patent No.: US 10,694,121 B2
(45) Date of Patent: Jun. 23, 2020

(54) SOLID-STATE IMAGING DEVICE, METHOD FOR DRIVING SOLID-STATE IMAGING DEVICE, AND ELECTRONIC APPARATUS

(71) Applicant: Brillnics Inc., Grand Cayman (KY)

(72) Inventors: Kazuya Mori, Tokyo (JP); Toshinori Otaka, Tokyo (JP); Isao Takayanagi, Tokyo (JP)

(73) Assignee: BRILLNICS INC., Grand Cayman (KY)

( * ) Notice: Subject to any disclaimer, the term of this patent is extended or adjusted under 35 U.S.C. 154(b) by 92 days.

(21) Appl. No.: 16/143,090

(22) Filed: Sep. 26, 2018

(65) Prior Publication Data

US 2019/0098232 A1 Mar. 28, 2019

(30) Foreign Application Priority Data

Sep. 26, 2017 (JP) ................. 2017-185505

(51) Int. Cl.
| | | |
|---|---|---|
| *H04N 5/353* | (2011.01) | |
| *H04N 5/374* | (2011.01) | |
| *H04N 5/355* | (2011.01) | |

(Continued)

(52) U.S. Cl.
CPC ......... *H04N 5/353* (2013.01); *H01L 27/1461* (2013.01); *H01L 27/1464* (2013.01); *H01L 27/14609* (2013.01); *H01L 27/14612* (2013.01); *H01L 27/14634* (2013.01); *H04N 5/3559* (2013.01); *H04N 5/378* (2013.01);
(Continued)

(58) Field of Classification Search
CPC ............... H04N 5/353; H04N 5/37455; H04N 5/37452; H04N 5/3741; H04N 5/379; H04N 5/3559; H04N 5/378; H04N 5/357; H04N 5/2253; H04N 5/335; H01L 27/1461; H01L 27/14612; H01L 27/14609; H01L 27/14634; H01L 27/1464; H01L 27/14621; H01L 27/14636; H01L 24/16;
(Continued)

(56) References Cited

U.S. PATENT DOCUMENTS

| 7,164,114 B2 | 1/2007 | Lai et al. |
| 2008/0266434 A1 | 10/2008 | Sugawa et al. |

(Continued)

FOREIGN PATENT DOCUMENTS

| JP | 2005-278135 A | 10/2005 |
| JP | 2005-295346 A | 10/2005 |
| JP | 4317115 B2 | 8/2009 |

*Primary Examiner* — Shahbaz Nazrul
(74) *Attorney, Agent, or Firm* — Westerman, Hattori, Daniels & Adrian, LLP

(57) ABSTRACT

A solid-state imaging device, in which a signal holding part can hold a signal with respect to a voltage signal corresponding to an accumulated charge in a photoelectric conversion element of a photodiode PD1 which is transferred to an output node of a floating diffusion FD1 in a transfer period after an integration period and a signal with respect to a voltage signal corresponding to an overflow charge overflowing to the output node of the floating diffusion FD1 from at least the photodiode PD1 in any period among the photoelectric conversion element of the photodiode PD1 and the storage capacity element of the storage capacitor. Due to this, substantially, it becomes possible to realize a broader dynamic range and higher frame rate.

20 Claims, 33 Drawing Sheets

(51) Int. Cl.
*H01L 27/146* (2006.01)
*H04N 5/378* (2011.01)
*H04N 5/357* (2011.01)
*H04N 5/3745* (2011.01)
*H04N 5/369* (2011.01)
*H01L 23/00* (2006.01)

(52) U.S. Cl.
CPC ........... *H04N 5/379* (2018.08); *H04N 5/3741* (2013.01); *H04N 5/37452* (2013.01); *H04N 5/37455* (2013.01); *H01L 24/16* (2013.01); *H01L 27/14621* (2013.01); *H01L 27/14627* (2013.01); *H01L 27/14636* (2013.01); *H01L 27/14643* (2013.01); *H01L 2224/16145* (2013.01); *H04N 5/357* (2013.01)

(58) Field of Classification Search
CPC ..... H01L 2224/16145; H01L 27/14627; H01L 27/14643; H01L 2924/00014
See application file for complete search history.

(56) References Cited

U.S. PATENT DOCUMENTS

| | | |
|---|---|---|
| 2010/0181464 A1 | 7/2010 | Veeder |
| 2011/0199526 A1 | 8/2011 | Nitta et al. |
| 2017/0324916 A1* | 11/2017 | Sugawa ............... H04N 5/3745 |
| 2018/0054576 A1* | 2/2018 | Otaka ................. H04N 5/3559 |
| 2018/0234652 A1* | 8/2018 | Sugawa ................ H04N 5/378 |
| 2018/0376046 A1* | 12/2018 | Liu ........................... G01S 3/00 |
| 2019/0149754 A1* | 5/2019 | Otaka ............... H04N 5/35554 |
| | | 348/296 |
| 2019/0230306 A1* | 7/2019 | Liu ..................... H04N 5/3559 |
| 2019/0327430 A1* | 10/2019 | Kawazu ............ H04N 5/35563 |
| 2019/0378864 A1* | 12/2019 | Innocent ........... H01L 27/1463 |
| 2019/0379846 A1* | 12/2019 | Chen ................. H04N 5/37452 |
| 2019/0379848 A1* | 12/2019 | Berkovich ........... H04N 5/3692 |
| 2020/0007798 A1* | 1/2020 | Liu ....................... H04N 5/353 |
| 2020/0043971 A1* | 2/2020 | Sugawa ................ H04N 5/378 |

* cited by examiner

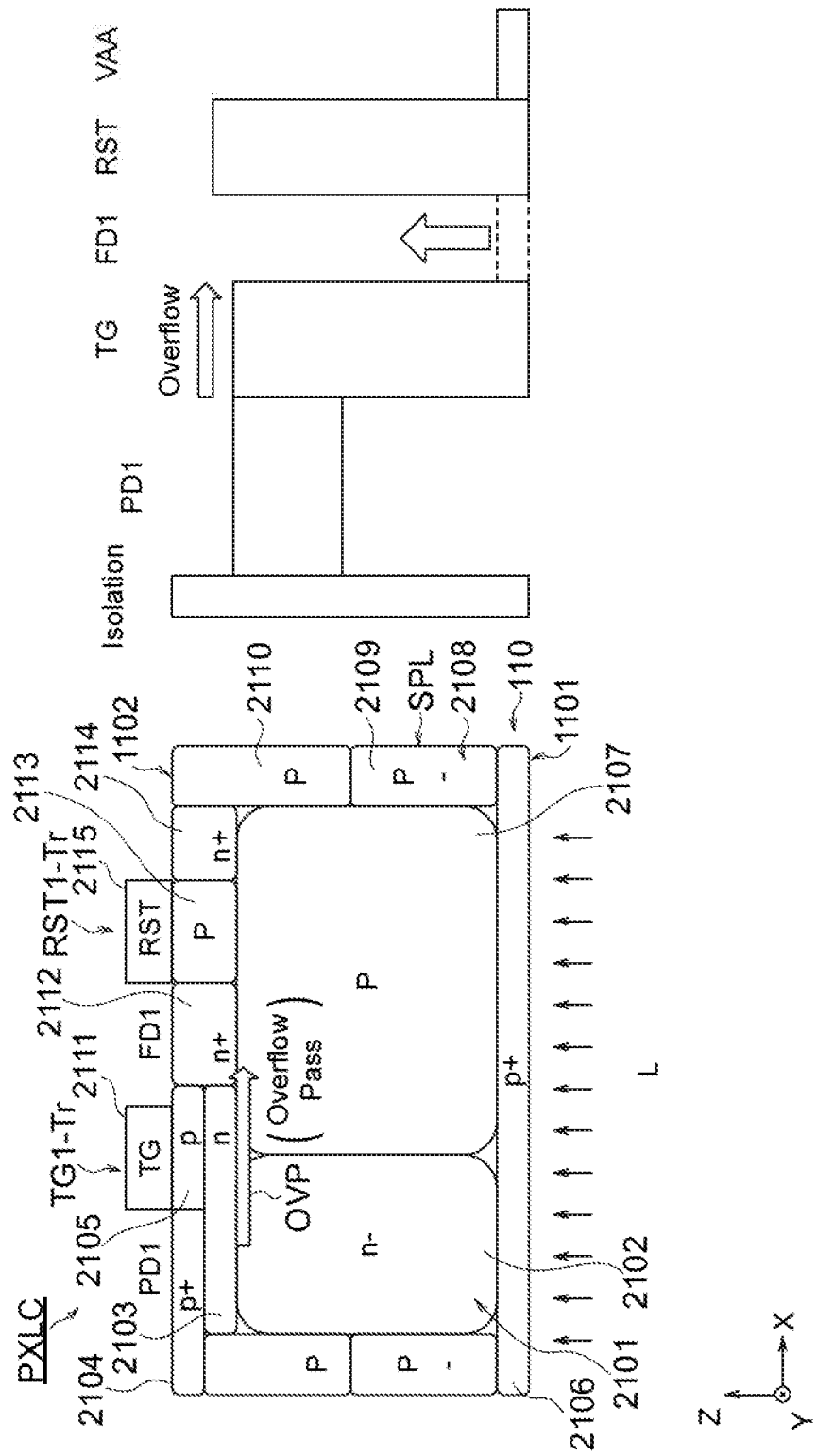
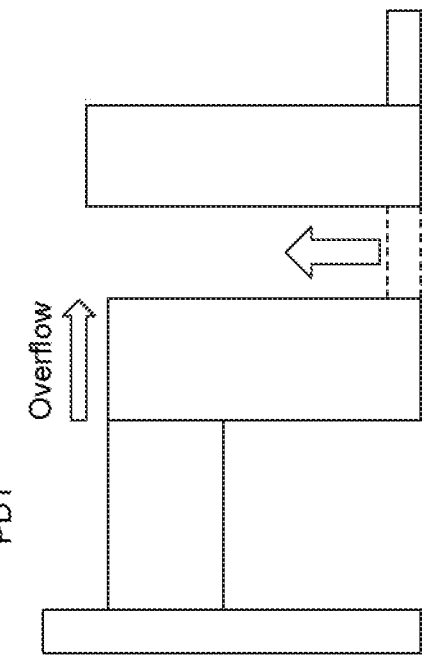

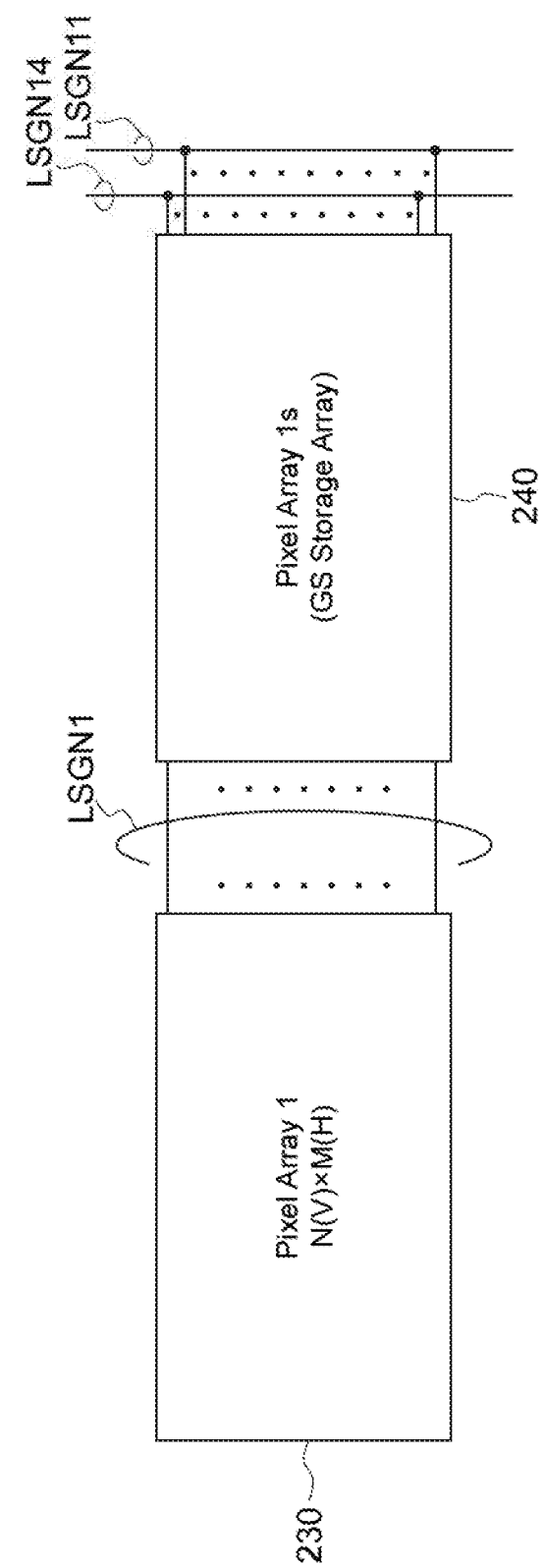

Light to time conversion plot at various reference voltage at comparator input

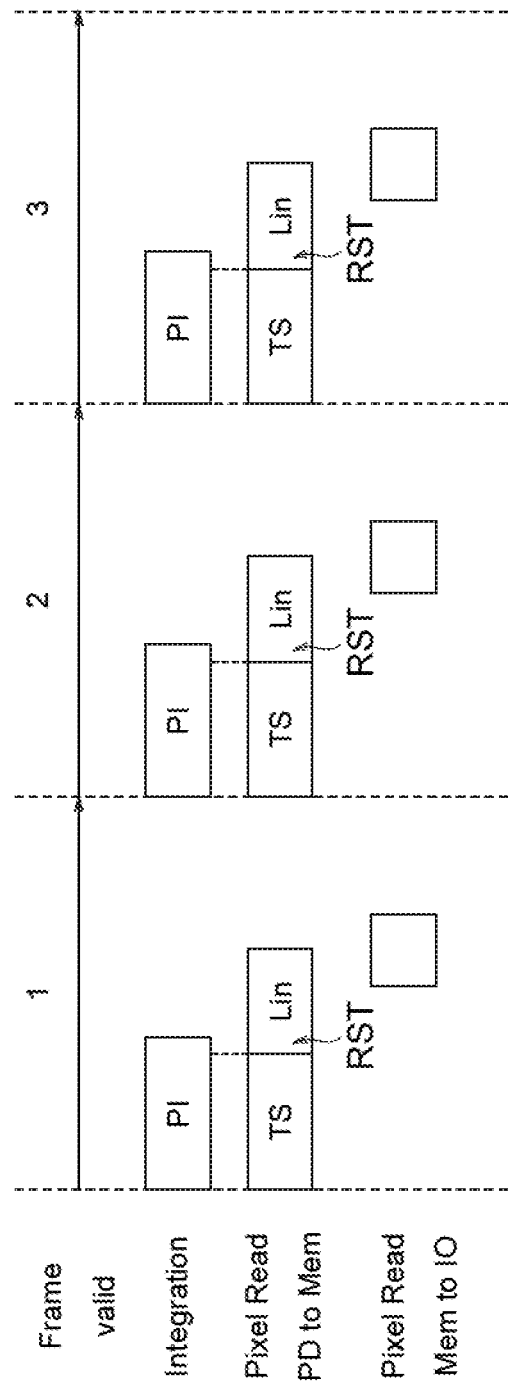

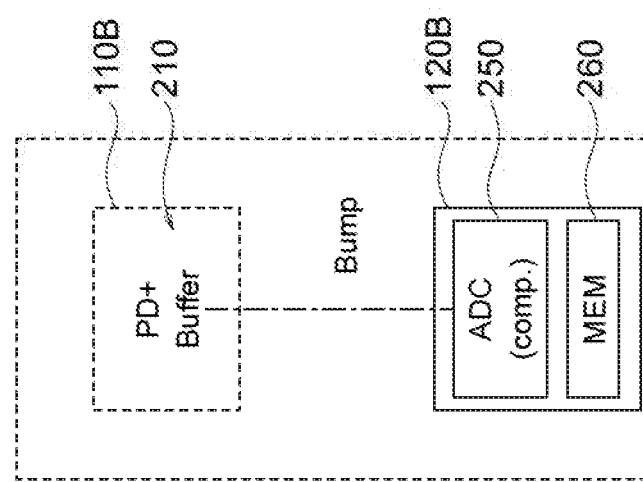
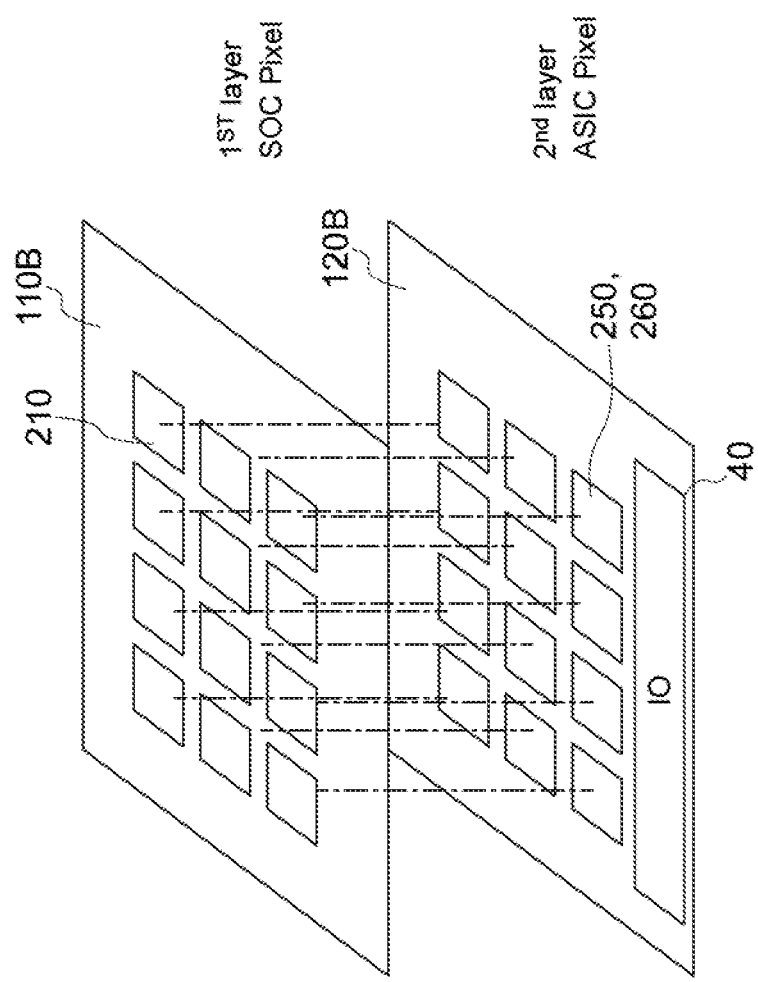

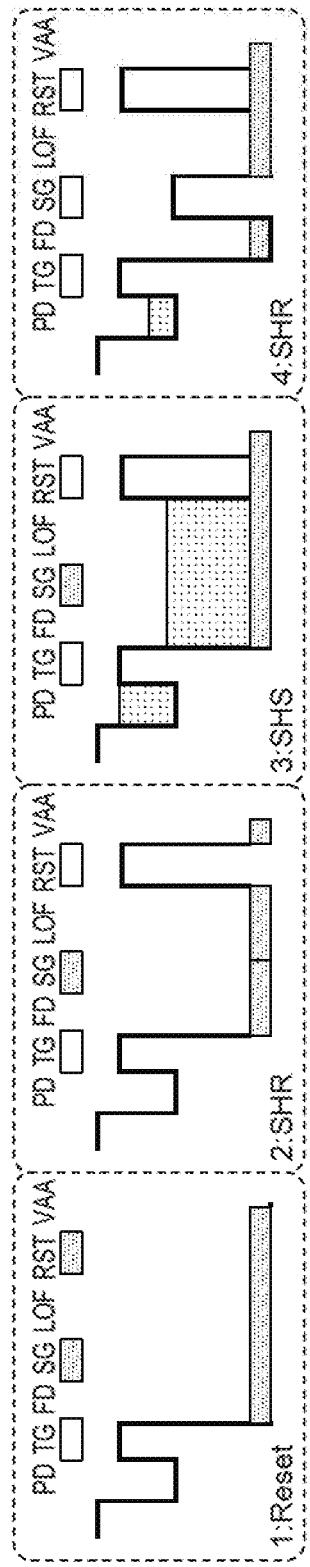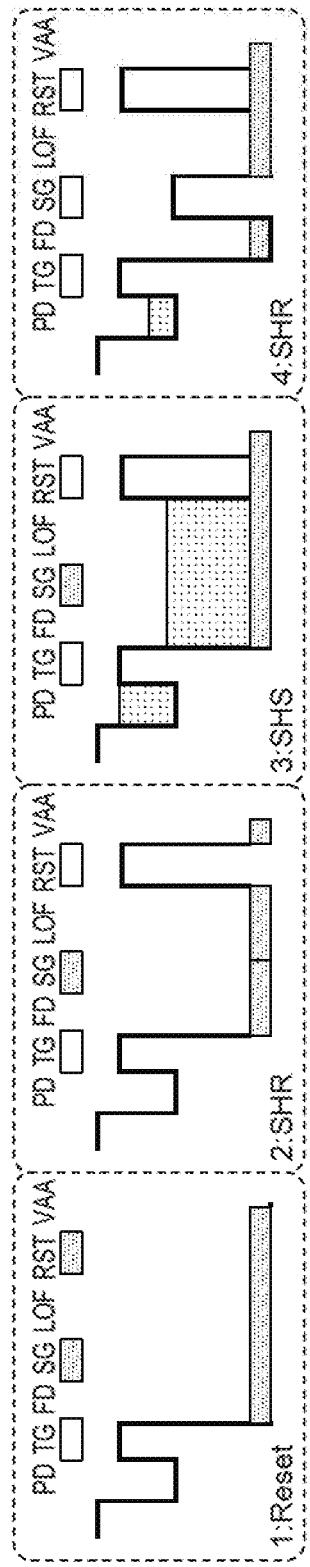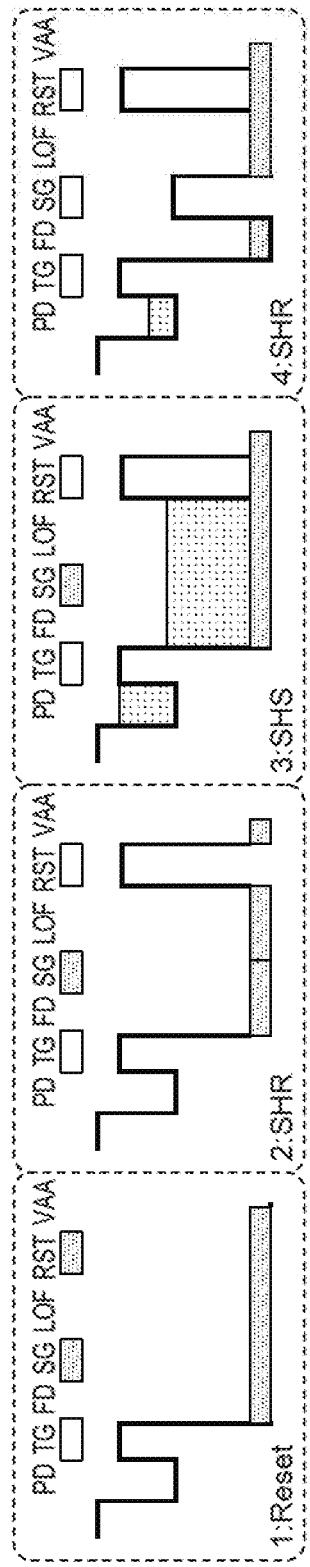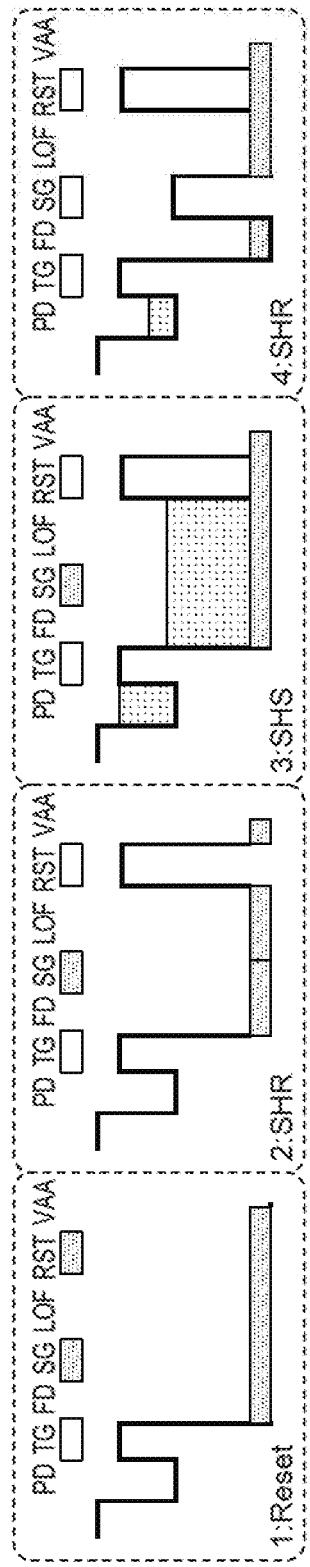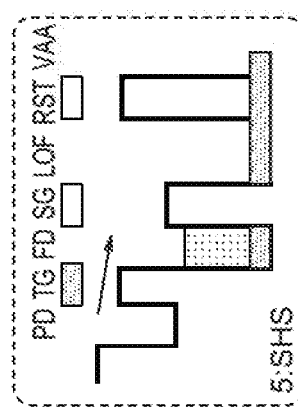
Operation sequence structure.
1: Global reset
2: Reset sampling for LOFIC
3: Signal sampling for LOFIC (dynamic signal sampling)
4: Reset sampling for FD
5: Signal sampling for FD

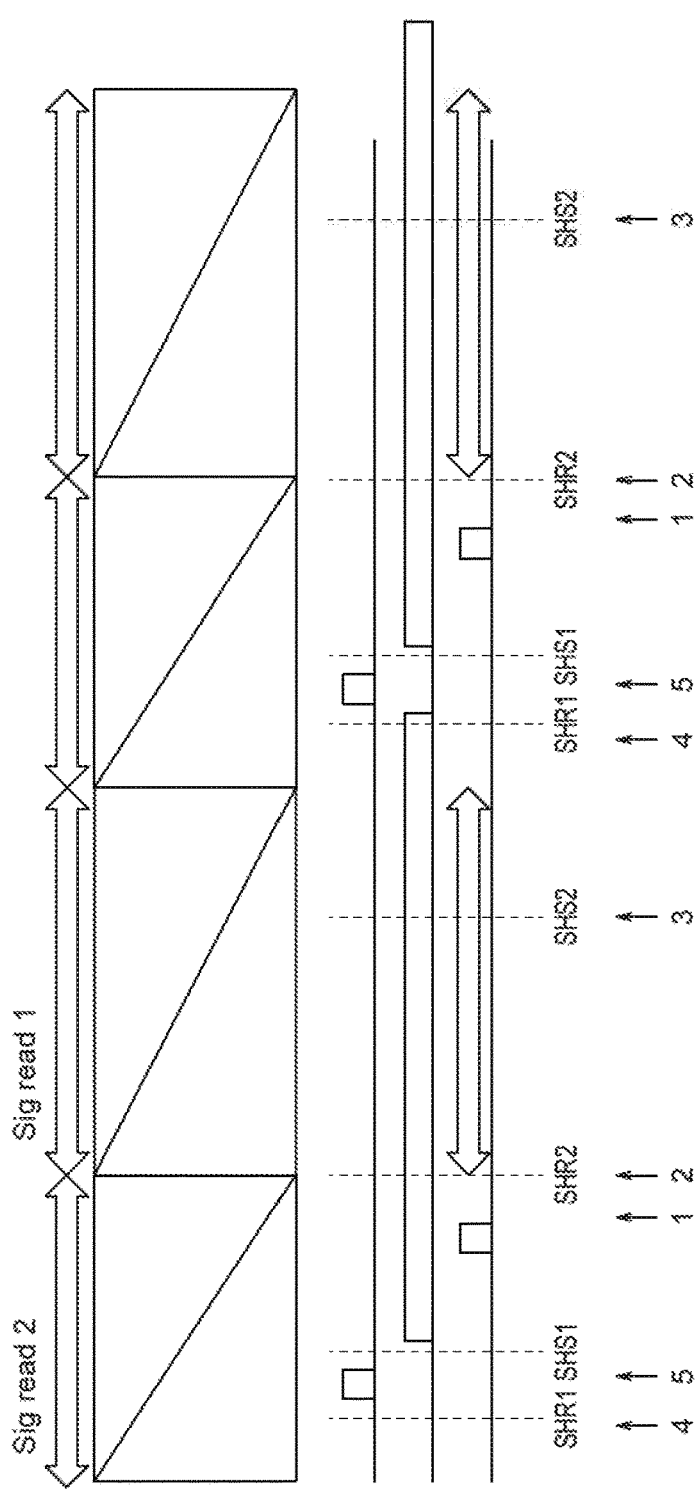

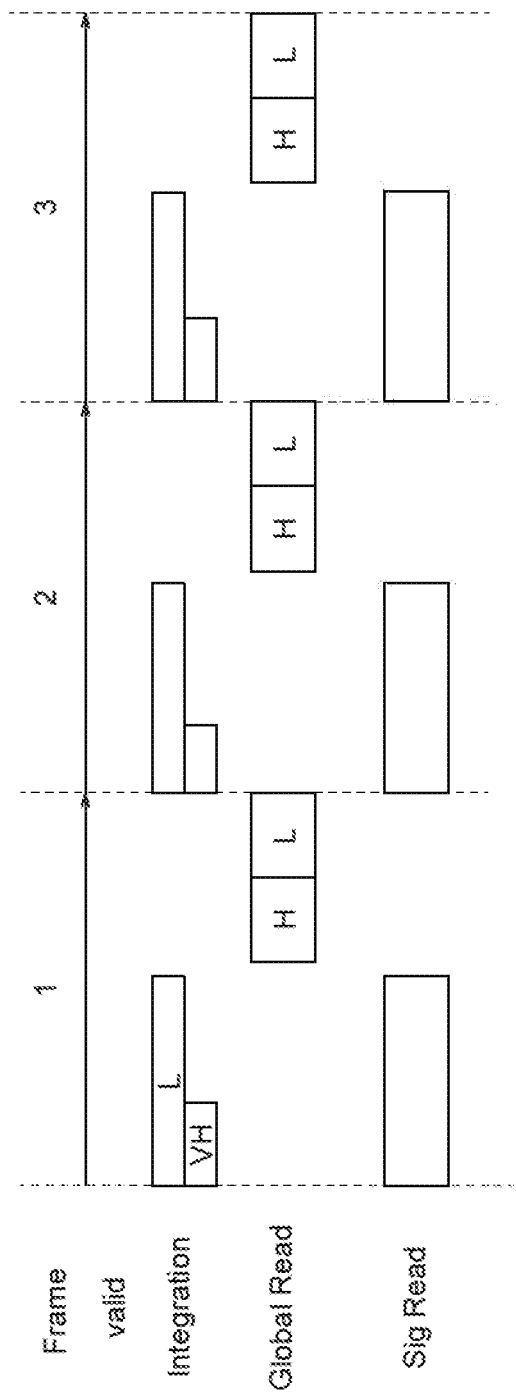

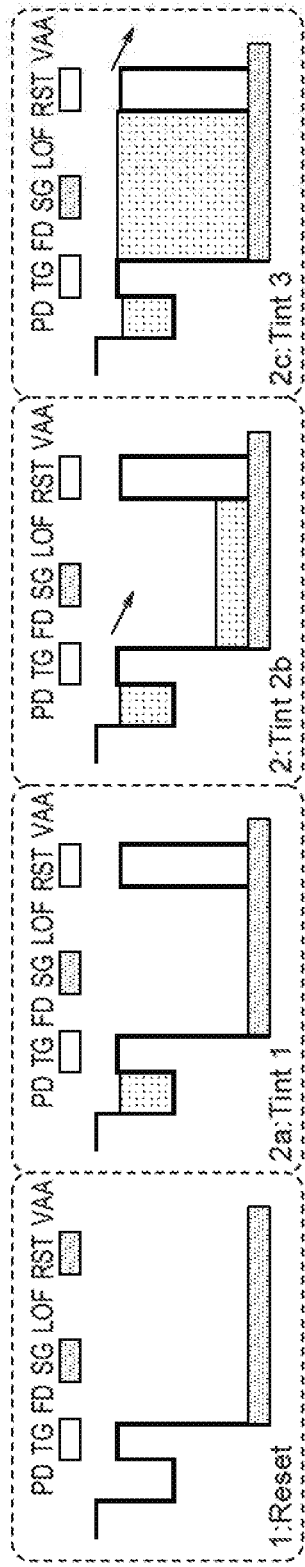
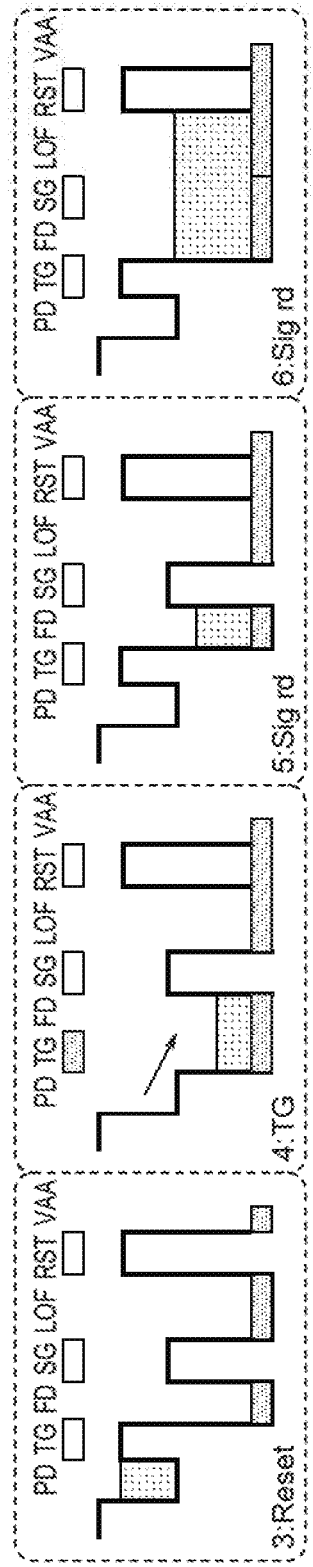
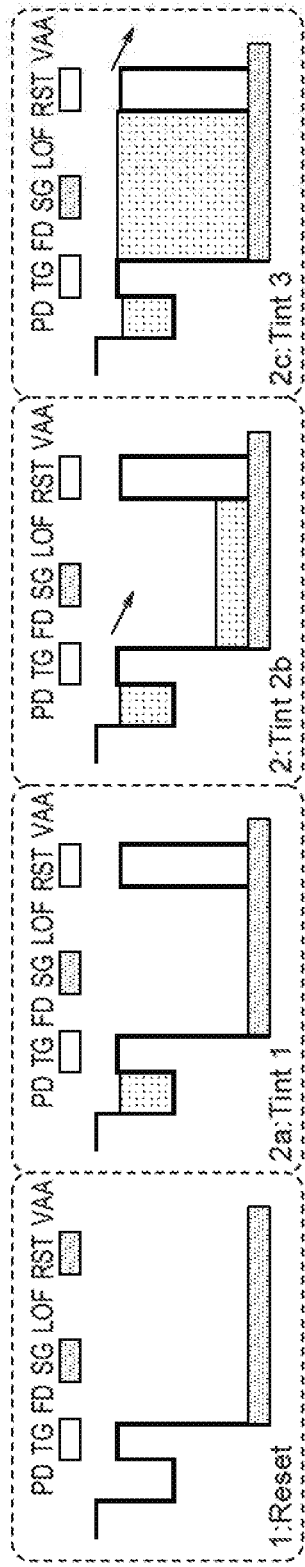
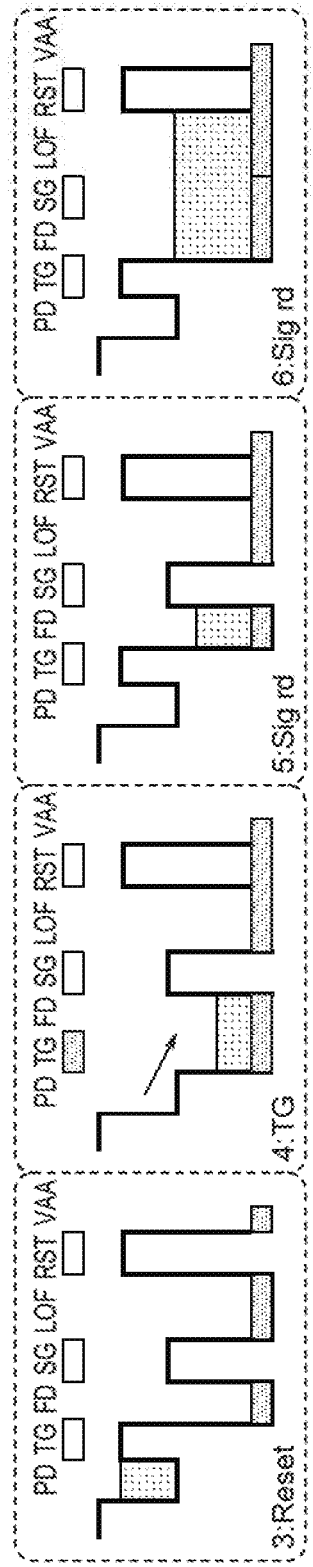
FIG. 25A, FIG. 25B, FIG. 25C, FIG. 25D, FIG. 25E, FIG. 25F, FIG. 25G, FIG. 25H
Operation sequence structure.
1: Global reset
2a: Integration & read 1 (low light ~ mid light < PD saturation)
2b: Integration & read 2 (Mid light ~ high light < LOFIC saturation)
2c: Integration & read 3 (high light ~ very high light > LOFIC saturation)
3: Rest FD (SHR 1)
4: TG transfer
5: Sig read (SHS)
6: Sig read (Lofic)

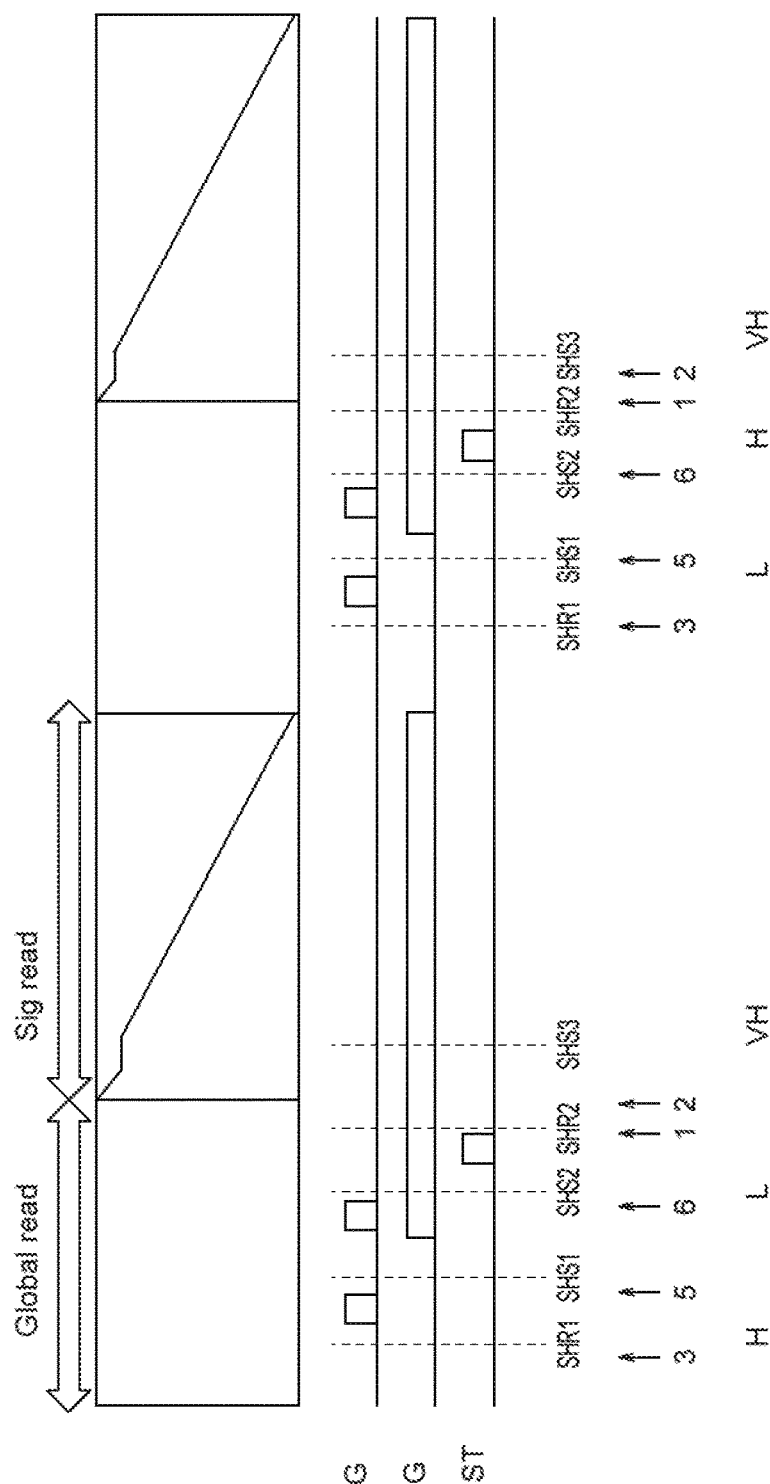

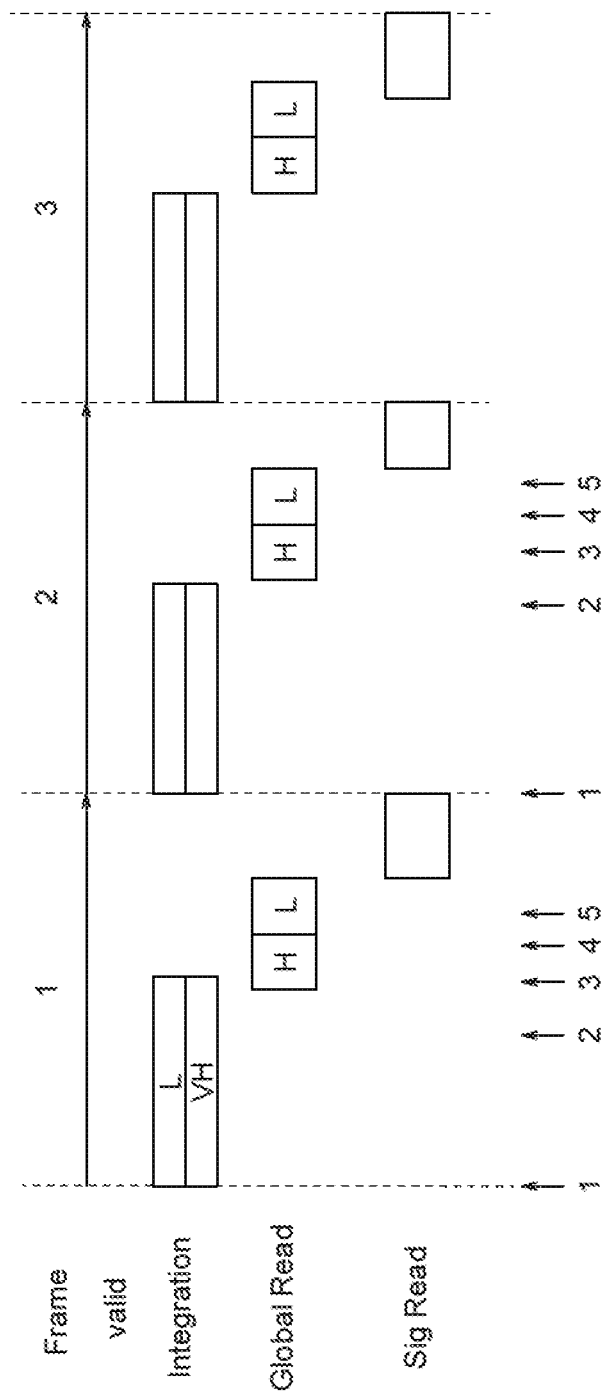

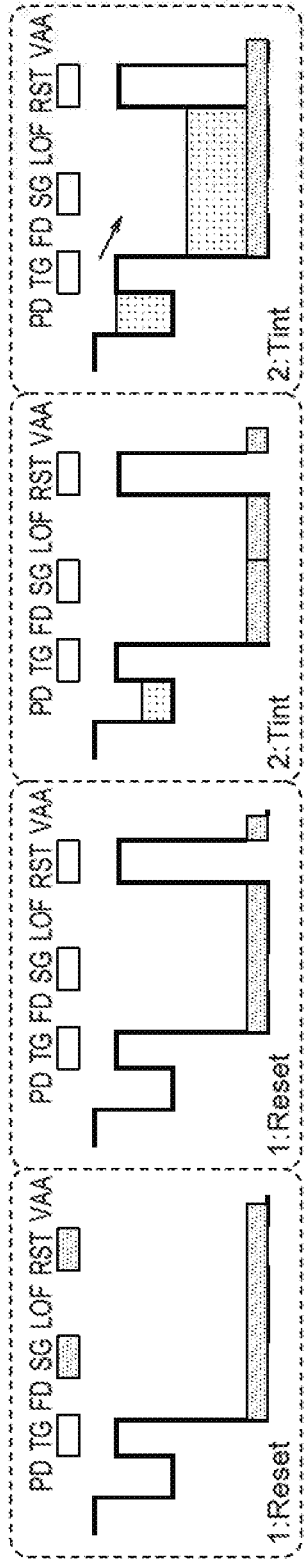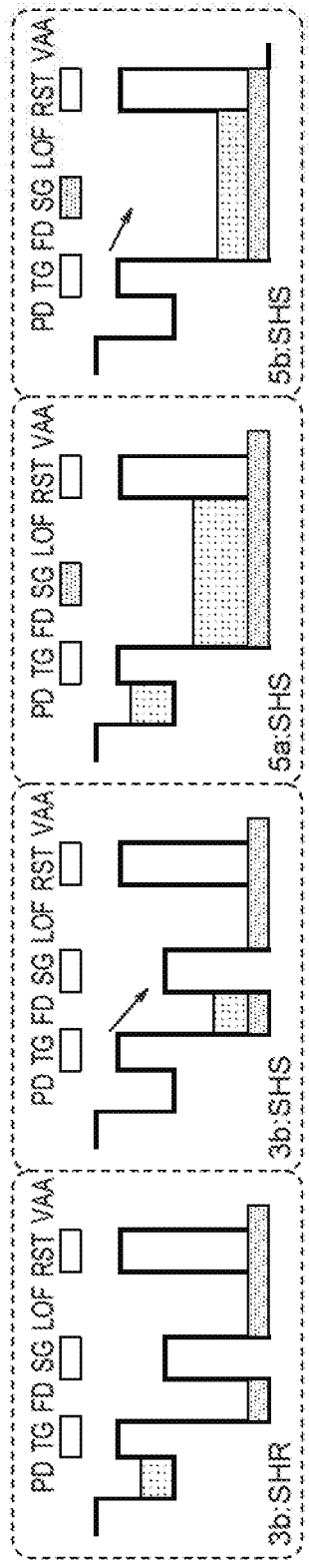
Operation sequence structure.
1: Global reset -> Time stamp
2: Global reset & reset sampling for LOFIC
3: Reset sampling for a); a) Before PD saturation b) after PD saturation
4: Signal sampling for a)
5: Signal sampling for b)

SOLID-STATE IMAGING DEVICE, METHOD FOR DRIVING SOLID-STATE IMAGING DEVICE, AND ELECTRONIC APPARATUS

CROSS-REFERENCE TO RELATED APPLICATIONS

The present invention contains subject matter related to Japanese Patent Application JP 2017-185505 filed in the Japan Patent Office on Sep. 26, 2017, the entire contents of which being incorporated herein by reference.

TECHNICAL FIELD

The present invention relates to a solid-state imaging device, a method for driving a solid-state imaging device, and an electronic apparatus.

BACKGROUND ART

As solid-state imaging devices (image sensors) using photoelectric conversion elements detecting light and generating a charge, CMOS (complementary metal oxide semiconductor) image sensors have been put into practical use. CMOS image sensors have been widely applied as parts of digital cameras, video cameras, monitoring cameras, medical endoscopes, personal computers (PC), mobile phones and other portable terminals (mobile devices) and other various types of electronic apparatuses.

A CMS image sensor has a floating diffusion (FD) amplifier having a photodiode (photoelectric conversion element) and an FD layer (FD) for each pixel. Reading is performed by selecting a certain row in a pixel array and simultaneously reading out the pixels in a column direction, that is, a column parallel output type is the mainstream.

In this regard, for improvement of characteristics, various methods for realizing CMODS image sensors of a high quality of image having a wide dynamic range have been proposed (for example see Japanese Patent No. 4317115 ("the '115 Publication")).

The '115 Publication describes a solid-state imaging device which is provided with photodiodes PD and storage capacities Cs and holds signal charges in the storage capacities Cs having higher capacity densities than the photodiodes PD to thereby increase the maximum signal to enable expansion of the dynamic range.

In this solid-state imaging device, at the time of high luminance, charges overflowing from the photodiodes PD are held in the storage capacities Cs. The high luminance signals overflowing to the storage capacities Cs are read out with a low conversion gain LCG (FD capacity CFd+Cs). The low luminance signals are read out with with a high conversion gain HCG (FD capacity CFd) in a high gain operation.

Further, various circuits have been proposed for the pixel signal read-out (output) circuit of a column parallel output type CMOS image sensor. Among them, one of the most advanced circuits is a circuit which is provided with an analog-to-digital converter (ADC) for each column and extracts pixel signals as digital signals (for example, see Japanese Patent Publication No. 2005-278135A ("the '135 Publication") and Japanese Patent Publication No. 2005-295346A ("the '346 Publication")).

In this column parallel ADC-mounting CMOS image sensor (column AD system CNbOS image sensor), a comparator compares a so-called RAMP wave and the pixel signals and performs digital CDS by a later stage counter to thereby perform AD conversion.

In this type of CMOS image sensor, however, while high speed transfer of signals is possible, there is the disadvantage that a global shutter reading operation cannot be carried out.

Contrary to this, a digital pixel sensor in which an ADC including a comparator (and further a memory part) is arranged in each pixel to also enable realization of a global shutter for executing the start of exposure and end of exposure at the same timings with respect to all pixels in the pixel array has been proposed (for example, see U.S. Pat. No. 7,164,114, B2, FIG. 4 and US 2010/0181464, A1).

Technical Problem

In this regard, however, in the solid-state imaging devices described in the '115 Publication, the '135 Publication, and the '346 Publication, it is difficult to realize a global shutter function. Further, for example, charges overflowing from the photodiodes in the integration period are not utilized in real time, therefore there is limit to achievement of a broader dynamic range and higher frame rate.

Further, in the COBS image sensors provided with conventional digital pixel sensors explained above, it is possible to realize the global shutter function, but for example charges overflowing from the photodiodes in the integration period are not utilized in real time, therefore there is limit to achievement of a broader dynamic range and higher frame rate.

Further, important performance indexes of CMOS image sensors include random noise. It is known that the main sources of random noise are the pixels and AD converters. In general, as techniques for reducing random noise, the methods are known of enlarging the transistor size to reduce flicker noise or of adding a capacity to the output of the comparator and lowering the bandwidth to thereby aim at a filter effect of noise by CDS. However, in each technique, there are disadvantages such as an increase in area, degradation of inversion delay of the comparator due to the increase of capacity, and the frame rate of the imaging element not being able to be raised.

Further, since an ADC (further a memory part) including a comparator is arranged in each pixel, it is difficult to expand the effective pixel region to the maximum limit and is difficult to maximize the value relative to the cost.

SUMMARY

The present invention provides a solid-state imaging device capable of substantially realizing a broader dynamic range and a higher frame rate, a method for driving such a solid-state imaging device, and an electronic apparatus. Further, the present invention provides a solid-state imaging device capable of substantially realizing a broader dynamic range and a higher frame rate and in addition capable of lowering noise, capable of expanding the effective pixel region to the maximum limit, and capable of raising the value relative to the cost to the maximum, a method for driving such a solid-state imaging device, and an electronic apparatus.

Solution to Problem

A solid-state imaging device of a first aspect of the present invention has a pixel part in which pixels are arranged, each pixel including a photoelectric converting and reading part and a signal holding part are arranged and has a reading part which reads out pixel signals from the pixel part, wherein each pixel includes a photoelectric conversion element which accumulates a charge generated by photoelectric conversion in an integration period, a transfer element capable of transferring the charge accumulated in the photoelectric conversion element in a transfer period after the integration period, an output node to which the charge accumulated in the photoelectric conversion element is transferred through the transfer element, an output buffer part which converts the charge at the output node to a voltage signal corresponding to the quantity of the charge and outputs the converted voltage signal, a storage transistor connected to the output node, a storage capacity element which accumulates the charge at the output node through the storage transistor, and a reset element which resets the output node to a predetermined potential in a reset period and wherein the signal holding part can hold a signal with respect to a voltage signal corresponding to the accumulated charge of the photoelectric conversion element transferred to the output node in the transfer period after the integration period and a signal with respect to a voltage signal corresponding to at least an overflow charge overflowing from the photoelectric conversion element to the output node in any period among the charges in the photoelectric conversion element and the storage capacity element.

A second aspect of the present invention is a method for driving a solid-state imaging device having a pixel part in which pixels are arranged, each pixel including a photoelectric converting and reading part and a signal holding part are arranged and having a reading part which reads out the pixel signals from the pixel part, wherein the pixel includes a photoelectric conversion element which accumulates a charge generated by photoelectric conversion in an integration period, a transfer element capable of transferring the charge accumulated in the photoelectric conversion element in a transfer period after the integration period, an output node to which the charge accumulated in the photoelectric conversion element is transferred through the transfer element, an output buffer part which converts the charge at the output node to a voltage signal corresponding to the quantity of the charge and outputs the converted voltage signal, a storage transistor connected to the output node, a storage capacity element which accumulates the charge at the output node through the storage transistor, and a reset element which resets the output node to a predetermined potential in a reset period and wherein the signal holding part can hold a signal with respect to a voltage signal corresponding to the accumulated charge of the photoelectric conversion element transferred to the output node in the transfer period after the integration period and a signal with respect to a voltage signal corresponding to at least an overflow charge overflowing from the photoelectric conversion element to the output node in any period among the charges in the photoelectric conversion element and the storage capacity element, comprising, when reading out the pixel signals of the pixels, under the control of the reading part, performing first comparison processing for outputting a digitalized first comparison result signal with respect to a voltage signal corresponding to the overflow charge overflowing from the photoelectric conversion element to the output node in the integration period and performing second comparison processing for outputting a digitalized second comparison result signal with respect to a voltage signal corresponding to the accumulated charge of the photoelectric conversion element transferred to the output node in the transfer period after the integration period.

An electronic apparatus of a third aspect of the present invention has a solid-state imaging device and an optical system for forming a subject image in the solid-state imaging device, wherein the solid-state imaging device has a pixel part in which pixels are arranged, each pixel including a photoelectric converting and reading part and a signal holding part are arranged and a reading part which reads out the pixel signals from the pixel part, wherein the pixel includes a photoelectric conversion element which accumulates the charge generated by photoelectric conversion in an integration period, a transfer element capable of transferring the charge accumulated in the photoelectric conversion element in a transfer period after the integration period, an output node to which the charge accumulated in the photoelectric conversion element is transferred through the transfer element, an output buffer part which converts the charge at the output node to a voltage signal corresponding to the quantity of the charge and outputs the converted voltage signal, a storage transistor connected to the output node, a storage capacity element which accumulates the charge at the output node through the storage transistor, and a reset element which resets the output node to a predetermined potential in a reset period, and wherein the signal holding part can hold a signal with respect to a voltage signal corresponding to the accumulated charge of the photoelectric conversion element transferred to the output node in the transfer period after the integration period and a signal with respect to a voltage signal corresponding to at least an overflow charge overflowing from the photoelectric conversion element to the output node in any period among the charges in the photoelectric conversion element and in the storage capacity element.

Advantageous Effects of Invention

According to the present invention, it becomes possible to substantially realize a broader dynamic range and a higher frame rate. Further, according to the present invention, it is possible to substantially realize a broader dynamic range and a higher frame rate and, in addition, is possible to lower noise and expand the effective pixel region to the maximum limit and possible to raise the value relative to the cost to the maximum limit.

BRIEF DESCRIPTION OF DRAWINGS

FIG. 3A and FIG. 3B are a simple cross-sectional view showing an example of the configuration of a principal part of the pixel according to the first embodiment of the present invention, that is, a charge integration and transfer system, and a potential diagram at the time of overflowing.

FIG. 4 is a view for explaining a pixel array in a pixel part in the solid-state imaging device according to the first embodiment of the present invention.

FIG. 19 is a view showing an example of a frame read out sequence in the solid-state imaging device according to the third embodiment of the present invention.

FIG. 20A and FIG. 20B are schematic views for explaining a stacked structure of the solid-state imaging device according to the third embodiment.

FIG. 22A to FIG. 22E are views showing the operation sequences and potential transitions for explaining mainly a first reading operation in the pixel part at the time of a predetermined shutter mode in the solid-state imaging device according to the third embodiment.

FIG. 23A to FIG. 23D are timing charts for mainly explaining a first reading operation in the pixel part at the time of a predetermined shutter mode in the solid-state imaging device according to the third embodiment.

FIG. 24 is a view showing an example of a frame read out sequence of the second reading method in the solid-state imaging device according to the third embodiment of the present invention.

FIG. 25A to FIG. 25H are views showing the operation sequences and potential transitions for mainly explaining the second reading operation in the pixel part at the time of a predetermined shutter mode in the solid-state imaging device according to the third embodiment.

FIG. 26A to FIG. 26D are timing charts for mainly explaining the second reading operation in the pixel part at the time of a predetermined shutter mode in the solid-state imaging device according to the third embodiment.

FIG. 29 is a view showing an example of a frame read out sequence of a third reading method in the solid-state imaging device according to the third embodiment of the present invention.

FIG. 30A to FIG. 30H are views showing the operation sequences and—potential transitions for mainly explaining the third reading operation in the pixel part at the time of a predetermined shutter mode in the solid-state imaging device according to the third embodiment.

DESCRIPTION OF EMBODIMENTS

Embodiments of the present invention will be hereinafter explained with reference to the drawings.

First Embodiment

Figure 1:
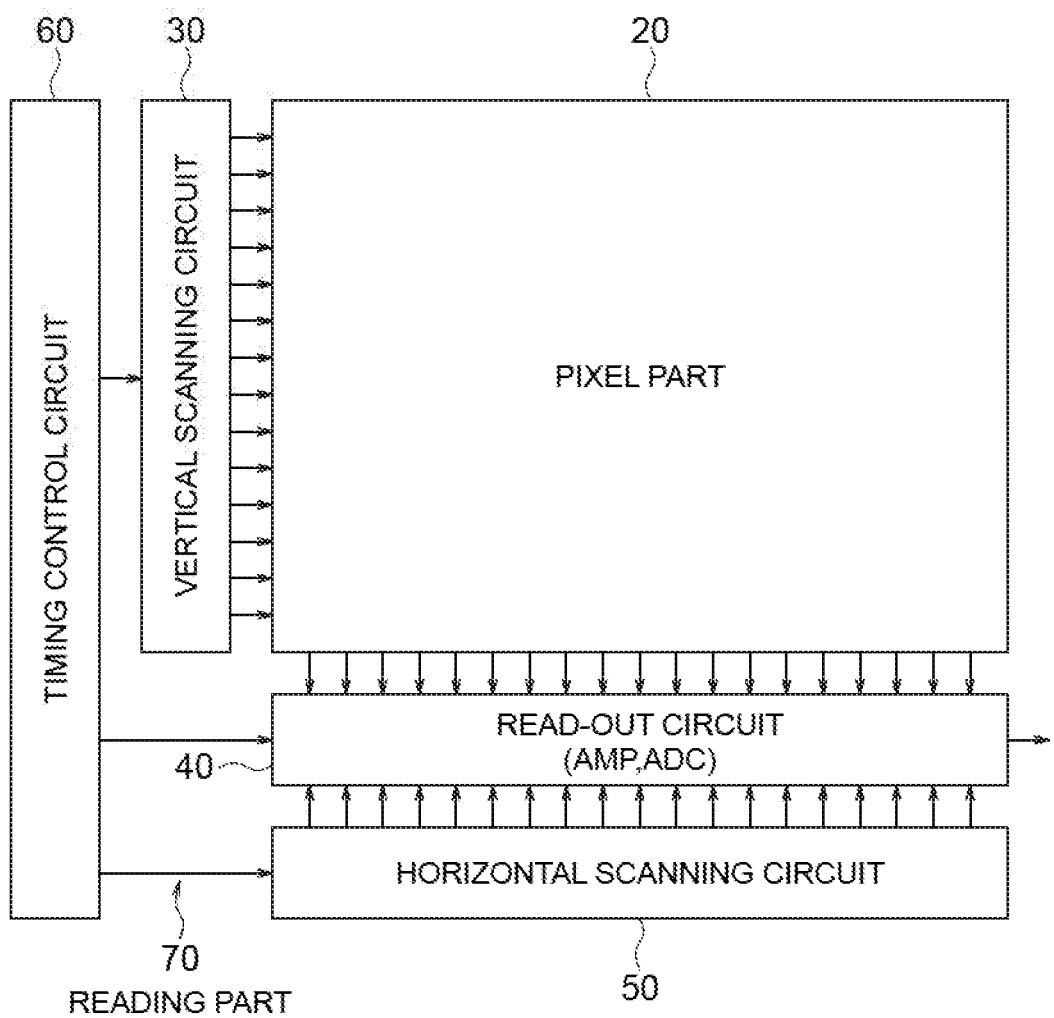
FIG. 1 is a block diagram showing an example of the configuration of a solid-state imaging device according to a first embodiment of the present invention.

FIG. 1 is a block diagram showing an example of the configuration of a solid-state imaging device according to a first embodiment of the present invention. In the present embodiment, a solid-state imaging device 10 is constituted by for example a CMDS image sensor.

As shown in FIG. 1, the solid-state imaging device 10 is constituted mainly by a pixel part 20, a vertical scanning circuit (row scanning circuit) 30, a read-out circuit (column read-out circuit) 40, a horizontal scanning circuit (column scanning circuit) 50, and a timing control circuit 60, which serve as an image capturing part. Among these components, for example, the vertical scanning circuit 30, read-out circuit 40, horizontal scanning circuit 50, and timing control circuit 60 constitute a reading part 70 for reading out pixel signals.

In the first embodiment, the solid-state imaging device 10 is configured as for example a laminated CMOS image sensor which, in the pixel part 20, includes pixels comprised of photoelectric converting and reading parts and signal holding parts, has an operation function as a global shutter, and makes it possible to substantially achieve a broader dynamic range and higher frame rate.

In the solid-state imaging device 10 of the first embodiment, the signal holding part can hold a signal with respect to a voltage signal corresponding to an accumulated charge in the photodiode PD1 as the photoelectric conversion element which was transferred to the floating diffusion FD1 as the output node in the transfer period after the integration period and a signal with respect to a voltage signal corresponding to the overflow charge overflowing to the floating diffusion FD1 as the output node from at least the photodiode PD1 in any period among the photodiode PD1 as the photoelectric conversion element and the storage capacitor as the storage capacity element. In the solid-state imaging device 10 according to the first embodiment, as will be explained in detail later, the signal holding part as the pixel signal storage is configured such that the pixel signals are sampled simultaneously for all of the pixels in the voltage mode, conversion signals corresponding to the read-out signals held in the first to fourth signal holding capacitors are read out to a predetermined signal line, and conversion signals corresponding to the read-out reset signals are read out to a predetermined signal line simultaneously and in parallel and are supplied to the column read-out circuit 40.

An outline of the configurations and functions of the parts in the solid-state imaging device 10 will be hereinafter described in detail, particularly including the configuration and function of the pixel part 20, the read-out processing related thereto, and the stacked structure of the pixel part 20 and reading part 70.

Configurations of Pixels and Pixel Part 20

Figure 2:
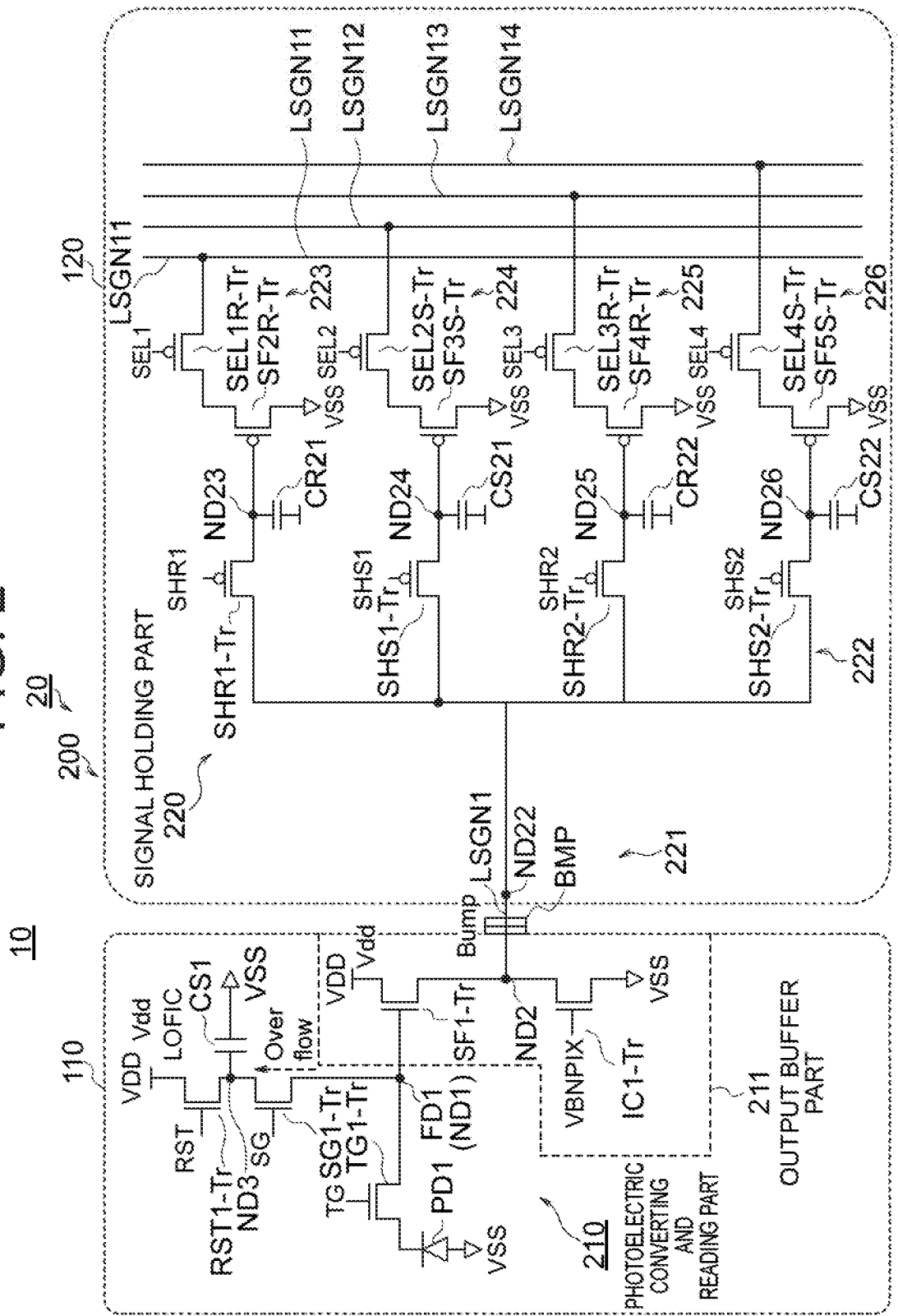
FIG. 2 is a circuit diagram showing an example of a pixel in the solid-state imaging device according to the first embodiment of the present invention.

FIG. 2 is a circuit diagram showing an example of a pixel of the solid-state imaging device 10 according to the first embodiment of the present invention.

A pixel 200 arranged in the pixel part 20 includes a photoelectric converting and reading part 210 and a signal holding part 220. As will be described in detail later, the pixel part 20 in the first embodiment is configured as a laminated CMDS image sensor constituted by a first substrate 110 and second substrate 120. In the present example, as shown in FIG. 2, the photoelectric converting and reading part 210 is formed on the first substrate 110, and the signal holding part 220 is formed on the second substrate 120.

The photoelectric converting and reading part 210 in the pixel 200 includes a photodiode (photoelectric conversion element) and an in-pixel amplifier. Specifically, the photoelectric converting and reading part 210 has for example a photodiode PD1 as a photoelectric conversion element. In association with the photodiode PD1, the photoelectric converting and reading part 210 has a transfer transistor TG1-Tr as a transfer element, a reset transistor RST1-Tr as a reset element, a source follower transistor SF1-Tr as a source follower element, a current transistor IC1-Tr as a current source element, a storage transistor SG1-Tr, a storage capacitor CS1 as a storage capacity element, a floating diffusion FD1 as an output node ND1, and a read-out node ND2. Thus, the photoelectric converting and reading part 210 in the digital pixel 200 according to the first embodiment includes the five transistors (5Tr): the transfer transistor TG1-Tr, the reset transistor RST1-Tr, the source follower transistor SF1-Tr, the current transistor IC1-Tr, and the storage transistor SG1-Tr.

Further, in the first embodiment, an output buffer part 211 includes the source follower transistor SF1-Tr, the current transistor IC1-Tr, and the read-out node ND2.

In the photoelectric converting and reading part 210 according to the first embodiment, the read-out node ND2 of the output buffer part 211 is connected to the input part of the signal holding part 220. The photoelectric converting and reading part 210 converts the charge in the floating diffusion FD1 as the output node to a voltage signal corresponding to the quantity of charge and outputs the converted voltage signal VSL to the signal holding part 220.

More specifically, the photoelectric converting and reading part 210 outputs a voltage signal VSL corresponding to the overflow charge overflowing to the floating diffusion FD1 as the output node from the photodiode PD1 as the photoelectric conversion element and the storage capacitor CS1 as the storage capacity element in the integration period PI.

Further, the photoelectric converting and reading part 210 outputs a voltage signal VSL corresponding to the accumulated charge of the photodiode PD1 which was transferred to the output node of the floating diffusion FD1 in the transfer period PT after the integration period PI. The photoelectric converting and reading part 210 outputs the pixel signals of the read-out reset signal (signal voltage) (VRST) and read-out signal (signal voltage) (VSIG) to the signal holding part 220.

The photodiode PD1 generates a signal charge (here, electrons) in an amount in accordance with the quantity of the incident light and accumulates the same. Below, an explanation will be given of a case where the signal charge is electrons and each transistor is an n-type transistor. However, the signal charge may be positive holes (holes) or each transistor may be a p-type transistor as well. Further, the present embodiment is effective also in a case where each transistor is shared among a plurality of photodiodes and transfer transistors.

In each pixel 200, as the photodiode (PD), use is made of a pinned photodiode (PPD). On the substrate surface for forming the photodiode (PD), there is a surface level due to dangling bonds or other defects, therefore a lot of charges (dark current) are generated due to heat energy, so a correct signal ends up being unable to be read out. In a pinned photodiode (PPD), the charge accumulation part of the photodiode (PD) is pinned in the substrate, so it becomes possible to reduce mixing the dark current into the signal.

The transfer transistor TG1-Tr in the photoelectric converting and reading part 210 is connected between the photodiode PD1 and the floating diffusion FD1 and is controlled by a control signal TG applied through a control line to the gate. The transfer transistor TG1-Tr is selected and becomes a conductive state in the transfer period PT in which the control signal TG is a high (H) level. It transfers the charge (electrons) which is photo-electrically converted and accumulated in the photodiode PD1 to the floating diffusion FD1. Note that, after the photodiode PD1 and floating diffusion FD1 are reset to the predetermined reset potentials, the transfer transistor TG1-Tr becomes a non-conductive state in which the control signal TG is a low (L) level, and the photodiode PD1 enters into the integration period PI. However, at this time, if the strength (quantity) of the incident light is very high, the charge exceeding the saturated charge amount overflows to the floating diffusion FD1 as the overflow charge through the overflow path under the transfer transistor TG1-Tr. Further, in a case of very high light, for example the charge exceeding the saturated charge amount of the floating diffusion FD1 overflows to the storage capacitor CS1 side as the overflow charge through the overflow path under the storage transistor SG1-Tr.

The reset transistor RST1-Tr is connected between the power supply line Vdd of the power supply voltage VDD and the floating diffusion FD1 and is controlled by the control signal RST supplied through the control line to the gate. The reset transistor RST1-Tr is selected and becomes a conductive state in the reset period in which the control signal RST is the H level and resets the floating diffusion FD1 to the potential of the power supply line Vdd of the power supply voltage VDD.

The storage transistor SG1-Tr is connected between the floating diffusion FD1 and the reset transistor RST1-Tr, while the storage capacitor CS1 is connected between a connection node ND3 thereof and the reference potential VSS. The storage transistor SG1-Tr is controlled by the control signal SG supplied through the control line to the gate. The storage transistor SG1-Tr is selected and becomes a conductive state in the reset period in which the control signal SG is the H level and connects the floating diffusion FD1 and the storage capacitor CS1.

The source follower element of the source follower transistor SF1-Tr is connected at the source to the read-out node ND2, is connected at the drain side to the power supply line Vdd, and is connected at the gate to the floating diffusion FD1. The drain and source of the current source element of the current transistor IC1-Tr are connected between the read-out node ND2 and the reference potential VSS (for example GMD). The gate of the current transistor IC1-Tr is connected to a supply line of a control signal VBNPIX. Further, a signal line LSGN1 between the read-out node MD2 and the input part of the signal holding part 220 is driven by the current source element of the current transistor IC1-Tr.

FIG. 3A and FIG. 3B are a schematic cross-sectional view showing an example of the configuration of the principal part of a pixel according to the first embodiment of the present invention, that is, the charge integration and transfer system, and a potential diagram at the time of overflowing.

Each pixel cell PXLC is formed on a substrate (first substrate 110 in the present example) having a first substrate surface 1101 side to which the light L is irradiated (for example back surface side) and a second substrate surface 1102 side on the side opposite to this first substrate surface 1101 side and is separated by separation layers SPL. Further, the digital pixel cell PLXC in FIG. 3A is configured including parts forming the photoelectric converting and reading part 210 such as the photodiode PD1, transfer transistor TG1-Tr, floating diffusion FD1, reset transistor RST1-Tr, separation layers SPL, and further a not shown color filter part and micro-lens.

Configuration of Photodiode

The photodiode PD1 includes a semiconductor layer (n-layer in the present embodiment) 2101 of a first conductivity type (n-type in the present embodiment) formed so as to be pinned in the semiconductor substrate having the first substrate surface 1101 side and the second substrate surface 1102 side on the side opposite to the first substrate surface 1101 side and is formed so as to have a photoelectric conversion function of the received light and charge accumulating function. In the side portions of the photodiode PD1 in a direction (X-direction in the orthogonal coordinate system in the drawing) perpendicular to the normal line of the substrate, second conductivity type (p-type in the present embodiment) separation layers SPL are formed.

In this way, in the present embodiment, in each pixel cell PXLC, as the photodiode (PD), use is made of a pinned photodiode (PPD). On the substrate surface for forming the photodiode (PD), there is a surface level due to dangling bonds or other defects, therefore a lot of charges (dark current) are generated due to heat energy, so a correct signal ends up being unable to be read out. In a pinned photodiode (PPD), the charge storage part of the photodiode (PD) is pinned in the substrate, so it becomes possible to reduce mixing the dark current into the signal.

In the photodiode PD1 in FIG. 3A, the n-layer (first conductivity type semiconductor layer) 2101 is configured so as to have a two-layer structure in the normal line direction of the substrate 110 (Z-direction in the orthogonal coordinate system in the drawing). In the present example, an $n^-$-layer 2102 is formed on the first substrate surface 1101 side, an n-layer 2103 is formed on the second substrate surface 1102 side of this $n^-$-layer 2102, and $p^+$-layer 2104 and p-layer 2105 are formed on the second substrate surface 1102 side of this n-layer 2103. Further, a $p^+$-layer 2106 is formed on the first substrate surface 1101 side of the $n^-$-layer 2102. The $p^+$-layer 2106 is formed uniformly covering not only the photodiode PD1, but also the separation layers SPL and further other digital pixel cells PXLC.

Note that, on the light incident side of this $p^+$-layer 2106, a color filter part is formed. Further, a micro-lens is formed on the light incident side of the color filter part so as to correspond to a portion of the photodiode PD1 and separation layers SPL.

These configurations are one example. The structure may be a single layer structure or may be a three-layer, four-layer, or higher stacked structure.

Configuration of Separation Layers in X-Direction (Column Direction)

In a p-type separation layer SPL in the X-direction (column direction) in FIG. 3A, a first p-layer (second conductivity type semiconductor layer) 2107 is formed on the side contacting the $n^-$-layer 2102 of the photodiode PD1 and at the right side part in the direction (X-direction in the orthogonal coordinate system in the drawing) perpendicular to the normal line of the substrate. Further, in a p-type separation layer SPL, on the right side in the X-direction of the first p-layer 2107, a second p-layer (second conductivity type semiconductor layer) 2108 is formed so as to give a two-layer structure in the normal line direction of the substrate 110 (Z-direction in the orthogonal coordinate system in the drawing). In the present example, in the second p-layer 2108, a $p^-$-layer 2109 is formed on the first substrate surface 1101 side, while a p-layer 2110 is formed on the second substrate surface 1102 side of this $p^-$-layer 2109.

These configurations are one example. The structure may be a single layer structure or may be a three-layer, four-layer, or higher stacked structure.

On the first substrate surface 1101 side of the first p-layer 2107 and second $p^-$-layer 2109 in the p-type separation layer SPL, a $p^+$-layer 2106 the same as the photodiode PD1 is formed.

An n-layer 2103 is formed so as to extend so that an overflow path OVP is formed covering a portion on the second substrate surface 1102 side of the first $p^-$-layer 2107 in the p-type separation layer SPL. Further, on the $p^+$-layer 2105 on the second substrate surface 1102 side of the n-layer 2103, a gate electrode 2111 of the transfer transistor TG1-Tr is formed through a gate insulation film. Further, on the second substrate surface 1102 side of the first $p^+$ layer 2107 in the p-type separation layer SPL, an $n^+$-layer 2112 for forming the floating diffusion FD1 is formed. A p-layer 2113 for forming the channel-forming region of the reset transistor RST1-Tr is formed adjacent to the $n^+$-layer 2112 while an $n^+$-layer 2114 is formed adjacent to the p-layer 2113. Further, on the p-layer 2113, a gate electrode 2115 is formed through a gate insulation film.

In such a structure, if the strength (quantity) of the incident light is very high, a charge exceeding the saturated charge amount overflows as the overflow charge to the floating diffusion FD1 through the overflow path OVP under the transfer transistor TG1-Tr.

The signal holding part 220 in the pixel 200, basically, is configured including an input part 221 including an input node ND22, sample/hold part 222, first output part 223, second output part 224, third output part 225, fourth output part 226, and holding nodes ND23 ND24, ND25, and ND26.

The input part 221 is connected to the read-out node ND2 of the photoelectric converting and reading part 210 through the signal line LSGN1 and inputs the read-out signal (VSIG1) output from the read-out node ND2 and the read-out reset signal (VRST1) to the sample/hold part 222.

The sample/hold part 222 is configured including a first switch element of a first sampling transistor SHR1-Tr, a second switch element of a second sampling transistor SHS1-Tr, a third switch element of a third sampling transistor SHR2-Tr, a fourth switch element of a fourth sampling transistor SHS2-Tr, a first signal holding capacitor CR21, a second signal holding capacitor CS21, a third signal holding capacitor CR22, and a fourth signal holding capacitor CS22.

The first sampling transistor SHR1-Tr is connected between the input node ND22 connected to the signal line LSGN1 and the holding node ND23. The first sampling transistor SHR1-Tr, in a global shutter period or clear period of the signal holding capacitor, selectively connects the first signal holding capacitor CR21 of the sample/hold part 222 through the holding node ND23 to the read-out node ND2 of the photoelectric converting and reading part 210. The first sampling transistor SHR1-Tr becomes a conductive state in for example a period in which the control signal SHR1 is a high level. The first signal holding capacitor CR21 is connected between the holding node ND23 and the reference potential VSS.

The second sampling transistor SHS1-Tr is connected between the input node ND22 connected to the signal line LSGN1 and the holding node ND24. The second sampling transistor SHS1-Tr, in a global shutter period or clear period of the signal holding capacitor, selectively connects the second signal holding capacitor CS21 of the sample/hold part 222 through the holding node MD24 to the read-out node ND2 of the photoelectric converting and reading part 210. The second sampling transistor SHS1-Tr becomes a conductive state in for example a period where the control signal SHS1 is a high level. The second signal holding capacitor CS21 is connected between the holding node ND24 and the reference potential VSS.

The third sampling transistor SHR2-Tr is connected between the input node ND22 connected to the signal line LSGN1 and the holding node ND25. The third sampling transistor SHR2-Tr, in a global shutter period or the clear period of the signal holding capacitor, selectively connects the third signal holding capacitor CR22 of the sample/hold part 222 through the holding node ND25 to the read-out node ND2 of the photoelectric converting and reading part 210. The third sampling transistor SHR2-Tr becomes a conductive state in for example a period where the control signal SHR2 is a high level. The third signal holding capacitor CR22 is connected between the holding node ND25 and the reference potential VSS.

The fourth sampling transistor SHS2-Tr is connected between the input node ND22 connected to the signal line LSGN1 and the holding node ND26. The fourth sampling transistor SHS2-Tr, in a global shutter period or the clear period of the signal holding capacitor, selectively connects the fourth signal holding capacitor CS22 of the sample/hold part 222 through the holding node HD26 to the read-out node ND2 of the photoelectric converting and reading part 210. The fourth sampling transistor SHS2-Tr becomes a conductive state in for example a period where the control signal SHS2 is a high level. The fourth signal holding capacitor CS22 is connected between the holding node ND26 and the reference potential VSS.

Note that, the first sampling transistor SHR1-Tr, second sampling transistor SHS1-Tr, third sampling transistor SHR2-Tr, and fourth sampling transistor SHS2-Tr are formed by MDS transistors, for example, p-channel MOS (PMOS) transistors.

The first output part 223 basically includes a second source follower element of a source follower transistor SF2R-Tr which, in a global shutter period, outputs the signal held in the first signal holding capacitor CR21 in accordance with the holding voltage. It selectively outputs the held signal through the selection transistor SEL1R-Tr to a vertical signal line LSGN11.

The source follower transistor SF2R-Tr and the selection transistor SEL1R-Tr are connected in series between the reference potential VSS and the vertical signal line LSGN11.

At the gate of the source follower transistor SF2R-Tr, the holding node ND23 is connected. The selection transistor SEL1R-Tr is controlled by the control signal SEL1 supplied to the gate through the control line. The selection transistor SEL1R-Tr is selected and becomes a conductive state in a selection period in which the control signal SEL1 is the H level. Due to this, the source follower transistor SF2R-Tr outputs the read-out voltage of the column output (VRST) in accordance with the holding voltage of the first signal holding capacitor CR21 to the vertical signal line LSGN11.

The second output part 224 basically includes a third source follower element of a source follower transistor SF3S-Tr which, in a global shutter period, outputs the signal held in the second signal holding capacitor CS21 in accordance with the holding voltage. It selectively outputs the held signal through the selection transistor SEL2S-Tr to the vertical signal line LSGN12.

The source follower transistor SF3S-Tr and the selection transistor SEL2S-Tr are connected in series between the reference potential VSS and the vertical signal line LSGN12.

At the gate of the source follower transistor SF3S-Tr, the holding node ND24 is connected. The selection transistor SEL2S-Tr is controlled by the control signal SEL2 supplied to the gate through the control line. The selection transistor SEL2S-Tr is selected and becomes conductive state in the selection period in which the control signal SEL2 is the H level. Due to this, the source follower transistor SF3S-Tr outputs the read-out voltage of the column output (VSIG) in accordance with the holding voltage of the second signal holding capacitor CS21 to the vertical signal line LSGN12.

The third output part 225 basically includes a fourth source follower element of a source follower transistor SF4R-Tr which, in a global shutter period, outputs the signal held in the third signal holding capacitor CR22 in accordance with the holding voltage. It selectively outputs the held signal through the selection transistor SEL3R-Tr to a vertical signal line LSGN13.

The source follower transistor SF4R-Tr and the selection transistor SEL3R-Tr are connected in series between the reference potential VSS and the vertical signal line LSGN13.

At the gate of the source follower transistor SF4R-Tr, the holding node ND25 is connected. The selection transistor SEL3R-Tr is controlled by a control signal SEL3 supplied to the gate through the control line. The selection transistor SEL3R-Tr is selected and becomes a conductive state in the selection period in which the control signal SEL3 is the H level. Due to this, the source follower transistor SF4R-Tr outputs the read-out voltage of column output (VRST) in accordance with the holding voltage of the third signal holding capacitor CR22 to the vertical signal line LSGN13.

The fourth output part 226 basically includes a fifth source follower element of a source follower transistor SF5S-Tr which, in a global shutter period, outputs the signal held in the fourth signal holding capacitor CS22 in accordance with the holding voltage. It selectively outputs the held signal through the selection transistor SEL4S-Tr to a vertical signal line LSGN14.

The source follower transistor SF5S-Tr and the selection transistor SEL4S-Tr are connected in series between the reference potential VSS and the vertical signal line LSGN14.

At the gate of the source follower transistor SF5S-Tr, the holding node ND26 is connected. The selection transistor SEL4S-Tr is controlled by a control signal SEL4 applied to the gate through the control line. The selection transistor SEL4S-Tr is selected and becomes a conductive state in the selection period in which the control signal SEL4 is the H level. Due to this, the source follower transistor SF5S-Tr outputs the read-out voltage of the column output (VSIG) in accordance with the holding voltage of the fourth signal holding capacitor CS22 to the vertical signal line LSGN14.

In this way, in the solid-state imaging device 10 according to the first embodiment, in the signal holding part 220 as the pixel signal storage, in the voltage mode, the pixel signals are simultaneously sampled for all of the pixels, and the conversion signals corresponding to the read-out signals held in the first signal holding capacitor CR21, second signal holding capacitor CS21, third signal holding capacitor CR22, and fourth signal holding capacitor CS22 are read out to the vertical signal lines LSGN11 to LSGN14 and are supplied to the column read-out circuit 40.

The pixel part 20 according to the first embodiment is for example configured comprised of the pixels 200 having the configuration as described above arranged, as shown in FIG. 4, as a pixel array and with a plurality of pixel arrays combined.

FIG. 4 is a view for explaining a pixel array in the pixel part 20 of the solid-state imaging device 10 according to the first embodiment of the present invention.

The pixel part 20 in the solid-state imaging device 10 according to the first embodiment is configured including a pixel array 230 and storage array 240.

In the pixel array 230, photoelectric converting and reading parts 210 of a plurality of pixels 200 are arranged in a two-dimensional matrix comprised of N rows and M columns. In the pixel array 230, the photoelectric converting and reading parts 210 of the plurality of pixels 200 are arranged in a two-dimensional matrix comprised of N rows and M columns so that output of an image having for example an aspect ratio of 16:9 is possible.

In the storage array 240, the signal holding parts 220 of the plurality of pixels 200 are arranged in a two-dimensional matrix comprised of N rows and M columns corresponding to the pixel array 230. In the storage array 240, in the same way as the pixel array 230, the signal holding parts 220 of the plurality of pixels 200 are arranged in a two-dimensional matrix comprised of N rows and M columns so that output of an image having for example an aspect ratio of 16:9 is possible.

If the solid-state imaging device 10 has the stacked structure of the first substrate (upper substrate) and second substrate (lower substrate) as will be explained later, the pixel array 230 is formed on the first substrate, and the storage array 240 is formed on the second substrate so as to face the pixel array 230. In this case, the storage array 240 may be completely shielded against by light by a metal wiring layer as well.

In the pixel part 20, under the control of the reading part 70, the pixel array 230 and storage array 240 are rendered active in the global shutter mode, and the pixel signals are read out.

In the pixel part 20, the reset transistors RST1-Tr and transfer transistors TG1-Tr are used to reset the photodiodes for all of the pixels to thereby start exposure simultaneously and in parallel for all of the pixels. Further, after the predetermined exposure period ends, the transfer transistors TG1-Tr are used to sample the output signals from the photoelectric converting and reading parts 210 in the signal holding parts 220 to thereby end the exposure simultaneously and in parallel for all of the pixels. Due to this, a complete shutter operation is realized electronically.

The vertical scanning circuit 30 drives the photoelectric converting and reading parts 210 and signal holding parts 220 in the pixels 200 through the row scanning control line in the shutter rows and read-out rows under the control of the timing control circuit 60. Further, the vertical scanning circuit 30, according to address signals, outputs row selection signals for the read row for reading out the signals and the shutter row for resetting the charges accumulated in the photodiodes PD1.

The column read-out circuit 40 includes a plurality of column signal processing circuits (not shown) arranged corresponding to the column outputs of the pixel part 20 and may be configured so that column parallel processing among the plurality of column signal processing circuits is possible as well. The column read-out circuit 40, at the time of the global shutter mode, performs amplification processing and AD conversion processing with respect to differential pixel signals pixout (VSL) read out from the signal holding parts 220 of the pixels 200 to the vertical signal lines LSGN11 to LSGN14.

Here, the pixel signals pixout (VSL) mean pixel read-out signals each including the read-out signal VSIG and read-out reset signal VRST which are read out in order from the pixels (the photoelectric converting and reading parts 210 of the pixels 200 and further the signal holding parts 220 in the present example) at the time of the global shutter mode.

In the solid-state imaging device 10 according to the first embodiment, the column read-out circuit 40 is comprised of a single circuit configuration and is formed so that it can be shared irrespective of the operation mode and form of the read-out signal (single end, differential signal, or other signal).

Figure 5:
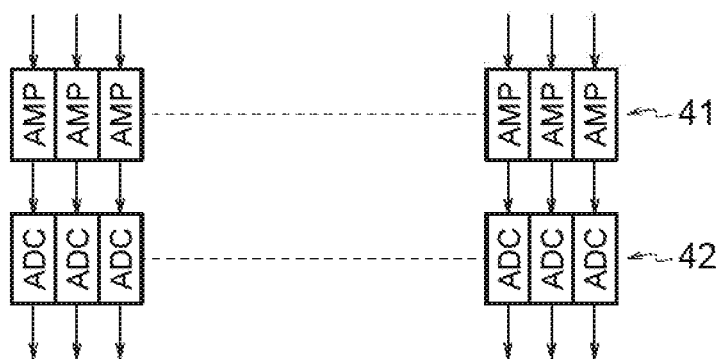
FIG. 5 is a view for explaining an example of the configuration of a reading system of column output in the solid-state imaging device according to the first embodiment.

The column read-out circuit 40, for example, as shown in FIG. 5, is configured including amplifiers (AMP) 41 and ADC (analog-to-digital converters: AD converters) 42.

The horizontal scanning circuit 50 scans the signals processed in the ADCs or other plurality of column signal processing circuits in the column read-out circuit 40 and transfers the same in the horizontal direction to output the results to a not shown signal processing circuit.

The timing control circuit 60 generates timing signals necessary for signal processing in the pixel part 20, vertical scanning circuit 30, read-out circuit 40, horizontal scanning circuit 50, and the like.

In the first embodiment, the reading part 70, for example, at the time of a global shutter mode, renders the pixel array 230 and storage array 240 active and performs a reading operation of the differential pixel signals pixout.

Stacked Structure of Solid-State Imaging Device 10

Next, the stacked structure of the solid-state imaging device 10 according to the first embodiment will be explained.

Figure 6A:
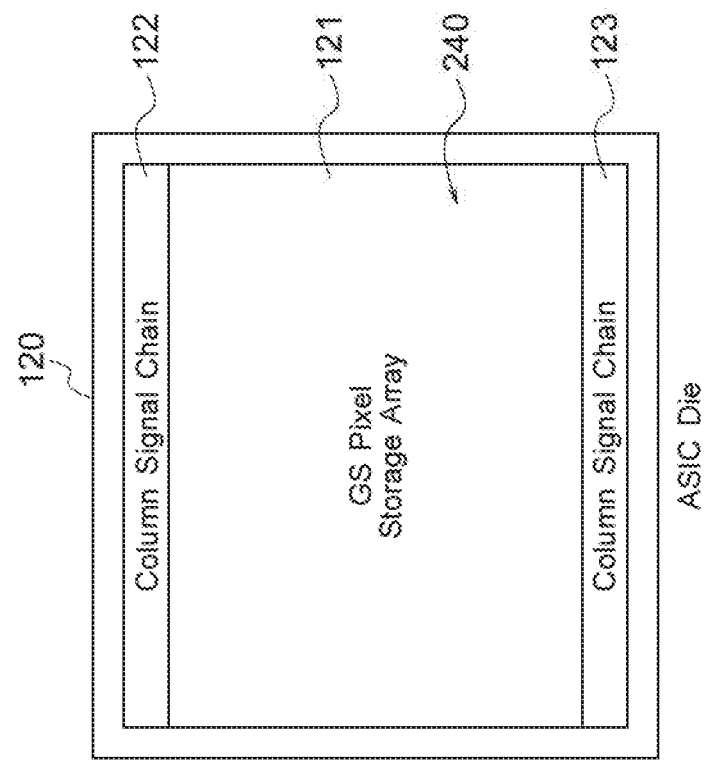
FIG. 6A and FIG. 6B are views for explaining a stacked structure of the solid-state imaging device according to the first embodiment.
Figure 6B:
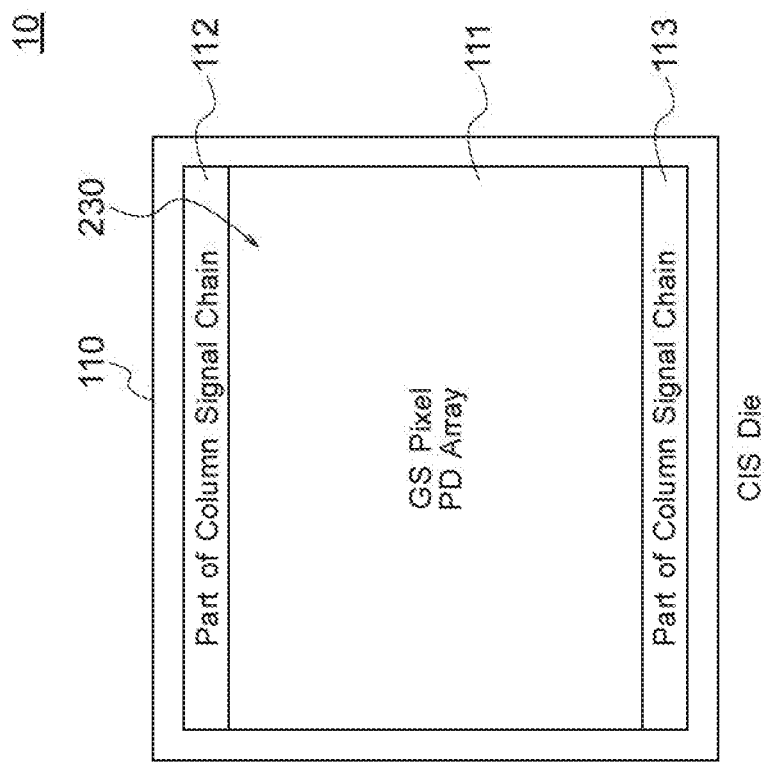

FIG. 6A and FIG. 6B are views for explaining the stacked structure of the solid-state imaging device 10 according to the first embodiment.

The solid-state imaging device 10 according to the first embodiment has a stacked structure of a first substrate (upper substrate) 110 and a second substrate (lower substrate) 120. The solid-state imaging device 10 is for example formed as an image capturing device having a stacked structure obtained by bonding the substrates to each other at a wafer level and cutting them by dicing. In the present example, the device is structured with the first substrate 110 stacked on the second substrate 120.

On the first substrate 110, the pixel array 230 (region 111) having the photoelectric converting and reading parts 210 of the pixels 200 in the pixel part 20 arranged therein is formed centered about its center part. Further, on the periphery of the pixel array 230, i.e., in the example in FIG. 6A, on the upper side and lower side in the view, regions 112 and 113 for parts of the column read-out circuit 40 are formed. Note that, a part of the column read-out circuit 40 may be arranged on either of the upper side or lower side of the region 111 in the pixel array 230 as well.

In this way, in the first embodiment, basically the photoelectric converting and reading parts 210 of the pixels 200 are formed in a matrix on the first substrate 110.

On the second substrate 120, the storage array 240 (region 121) having the signal holding parts 220 of the pixels 200 connected to the output nodes ND2 of the photoelectric converting and reading parts 210 in the pixel array 230 arranged in a matrix and the vertical signal lines LSGN11 to LSGN14 are formed centered about its center part. The storage array 240 may be completely shielded against light by the metal wiring layer as well. Further, on the periphery of the storage array 240, i.e., in the example in FIG. 6B, on upper side and lower side in the view, regions 122 and 123 for parts of the column read-out circuit 40 are formed. Note that, the column read-out circuit 40 may be configured so as to be arranged on either of the upper side or lower side of the storage array 240 as well. Further, on the lateral part side of the storage array 240, a region for the vertical scanning circuit 30 and regions of digital system and output system may be formed as well. Further, the vertical scanning circuit 30, horizontal scanning circuit 50, and timing control circuit 60 may be formed as well on the second substrate 120.

In such a stacked structure, the read-out nodes ND2 of the photoelectric converting and reading parts 210 in the pixel array 230 on the first substrate 110 and the input nodes ND22 of the signal holding parts 220 of the pixels 200 on the second substrate 120 are individually electrically connected using via micro bumps BMP and die-to-die vias and the like as shown in for example FIG. 2.

Reading Operation of Solid-State Imaging Device 10

The characteristic configurations and functions of the parts in the solid-state imaging device 10 were explained above. Next, an outline of the reading operation etc. of the differential pixel signals in the solid-state imaging device 10 according to the first embodiment will be explained.

Figure 7:
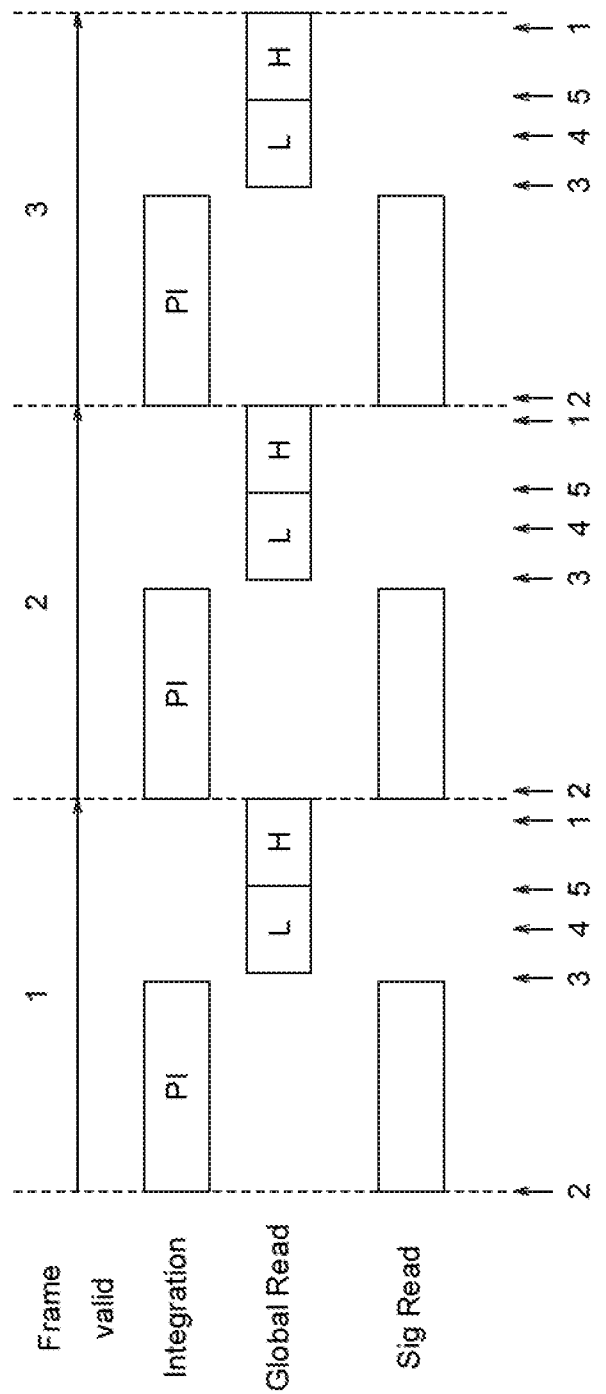
FIG. 7 is a view showing an example of a frame read out sequence in the solid-state imaging device according to the first embodiment of the present invention.
Figure 8:
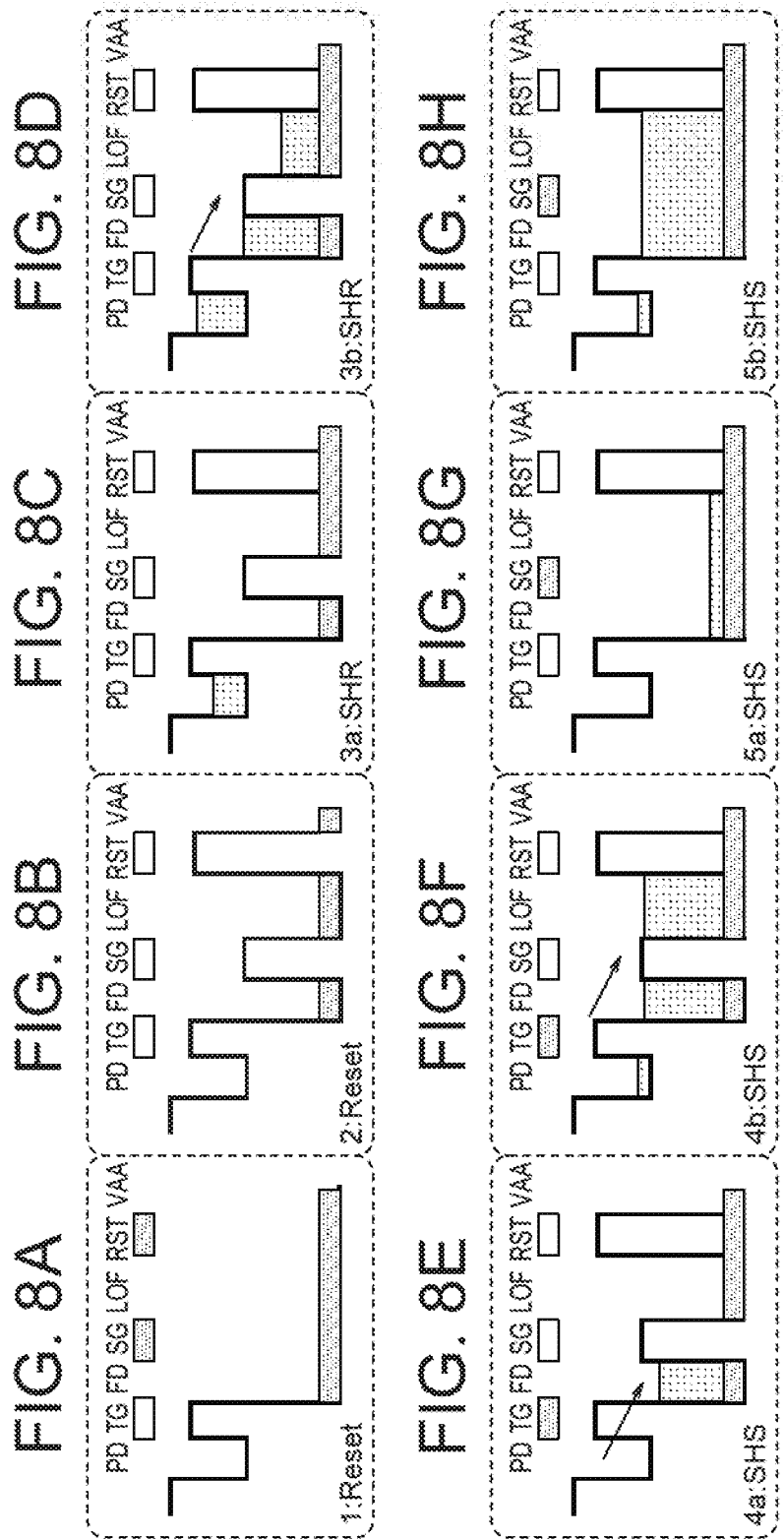
FIG. 8A to FIG. 8H are views showing operation sequences and potential transitions for explaining mainly the reading operation in the pixel part at the time of a predetermined shutter mode in the solid-state imaging device according to the first embodiment.
Figure 9:
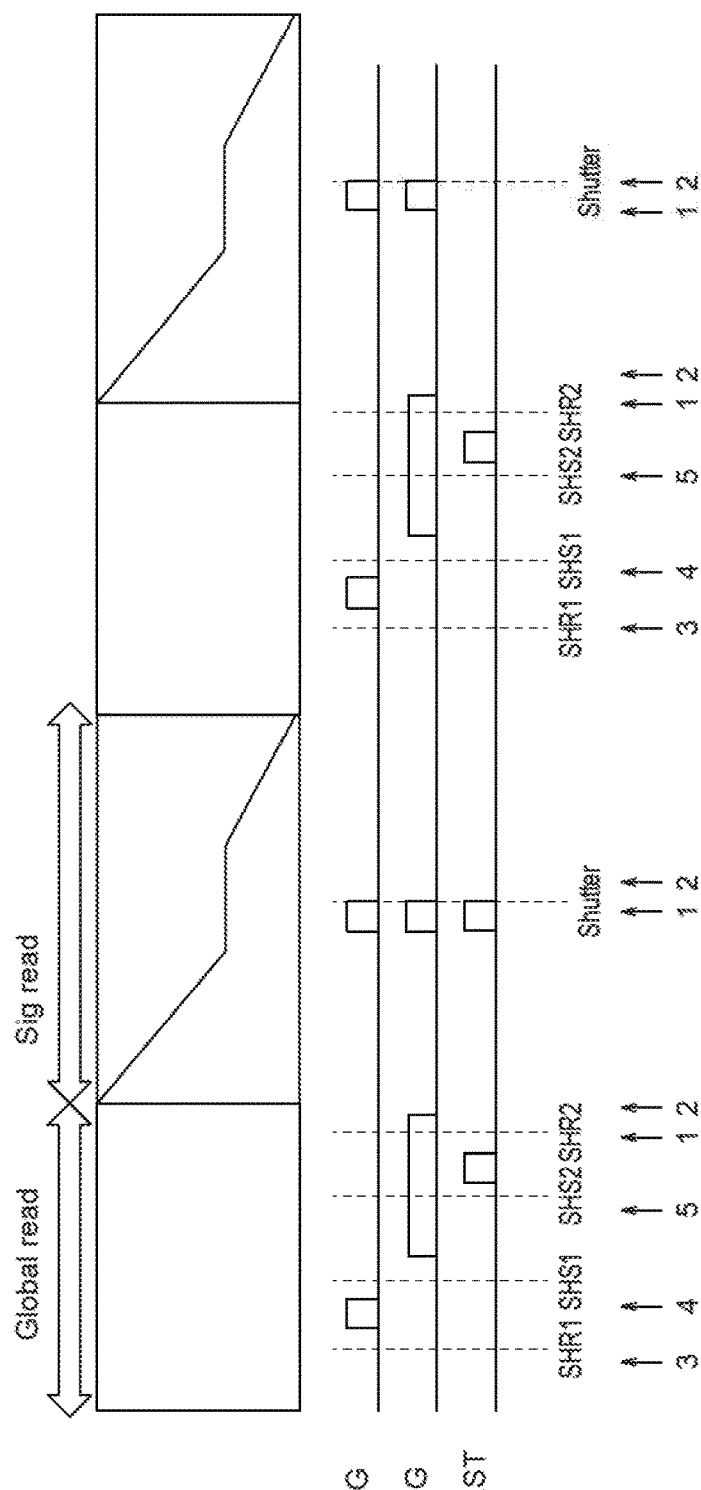
FIG. 9A to FIG. 9D are timing charts for explaining mainly the reading operation in the pixel part at the time of a predetermined shutter mode in the solid-state imaging device according to the first embodiment.

FIG. 7 is a view showing an example of a frame read out sequence in the solid-state imaging device according to the first embodiment of the present invention. FIG. 8A to FIG. 8H are views showing operation sequences and potential transitions for mainly explaining the reading operation in the pixel part at the time of a predetermined shutter mode of the solid-state imaging device according to the first embodiment. FIG. 9A to FIG. 9D are timing charts for mainly explaining the reading operation in the pixel part at the time of a predetermined shutter mode in the solid-state imaging device according to the first embodiment.

In the first embodiment, as shown in FIG. 7, after the integration period PI of charges in the photodiodes PD1 ends, low-light signal reading is carried out, and then high-light signal reading is carried out.

As the operation sequence, first, the transfer transistors TG1-Tr, storage transistors SG1-Tr, and reset transistors RST1-Tr are rendered the conductive state to perform a so-called global reset. Next, the read-out reset signals are sampled. Further, the read-out reset signals before saturation of the photodiodes PD1 and after saturation are sampled. Next, the read-out signals corresponding to the read-out reset signals before the photodiodes PD1 are saturated are sampled. Next, the read-out signals corresponding to the read-out reset signals after the photodiodes PD1 are saturated is sampled.

In this way, if the pixel signals VRST and VSIG of the pixels 200 are read out, in the signal holding part 220, when the charge does not overflow, the first read-out reset signal VRST1 is read out as the pixel signal from the photoelectric converting and reading part 210, the first switching transistor SHR1-Tr of the signal holding part 220 is rendered conductive for a predetermined period, and the first signal holding capacitor CR21 is made to hold this read-out reset signal VRST1. Further, the first read-out signal VSIG1 is read out as the pixel signal from the photoelectric converting and reading part 210, the second switching transistor SHS1-Tr of the signal holding part 220 is rendered conductive for a predetermined period, and the second signal holding capacitor CS21 is made to hold this read-out signal VSIG1.

When the charge is overflowing, the second read-out signal VSIG2 is read out as the pixel signal from the photoelectric converting and reading part 210, the fourth switching transistor SHS2-Tr of the signal holding part 220 is rendered conductive for a predetermined period, and the fourth signal holding capacitor CS22 is made to hold this read-out signal VSIG2. Further, the second read-out reset signal VRST2 is read out as the pixel signal from the photoelectric converting and reading part 210, the third switching transistor SHR2-Tr of the signal holding part 220 is rendered conductive for a predetermined period, and the third signal holding capacitor CR22 is made to hold this read-out reset signal VRST2.

Further, for example, in the column read-out circuit 40 configuring a portion of the reading part 70, the amplification processing and AD conversion processing with respect to the read-out reset signal VRST and read-out signal VSIG of the pixel signals pixout which are supplied simultaneously and in parallel are differentially carried out. Further, a difference of the two signals (VRST-VSIG) is taken and CDS processing is carried out.

As explained above, according to the first embodiment, the pixel part 20 is configured as for example a stacked type CMOS image sensor which includes the pixel array 230 in which the photoelectric converting and reading parts 210 of the plurality of pixels 200 are arranged in a matrix and the storage array 240 in which the signal holding parts 220 of the plurality of pixels 200 are arranged in a matrix.

That is, in the first embodiment, the solid-state imaging device 10 is configured as for example a stacked type CMOS image sensor in which the pixel part 20 includes the photoelectric converting and reading parts and signal holding parts as the pixels, the operation function of a global shutter is provided, and substantially realization of expansion of the dynamic range and raising of the frame rate is made possible. In the solid-state imaging device 10 in the first embodiment, the signal holding part can hold a signal with respect to a voltage signal corresponding to the accumulated charge in the photoelectric conversion element of the photodiode PD1 transferred to the output node of the floating diffusion FD1 in the transfer period after the integration period and hold a signal with respect to a voltage signal corresponding to the overflow charge overflowing to the output node of the floating diffusion FD1 from at least the photodiode PD1 in any period among the photoelectric conversion element of the photodiode PD1 and the storage capacity element of the storage capacitor CS1.

Accordingly, according to the solid-state imaging device 10 of the first embodiment, not only can a global shutter be realized, but also it becomes possible to realize a broader dynamic range and higher frame rate since the charge overflowing from the photodiode during the integration period can be utilized in real time. Further, according to the present invention, it is possible to substantially realize a broader dynamic range and higher frame rate and in addition possible to lower noise, possible to expand the effective pixel region to the maximum limit, and possible to raise the value relative to cost to the maximum limit.

Further, according to the solid-state imaging device 10 of the first embodiment, it is possible to prevent complication of the configuration while preventing a drop in the area efficiency in layout.

Further, the solid-state imaging device 10 according to the first embodiment has a stacked structure of the first substrate (upper substrate) 110 and second substrate (lower substrate) 120. Accordingly, in the first embodiment, basically, by forming the first substrate 110 side by only the NMOS system elements and by expanding the effective pixel region to the maximum limit by the pixel array, the value relative to the cost can be raised to the maximum limit.

Second Embodiment

Figure 10:
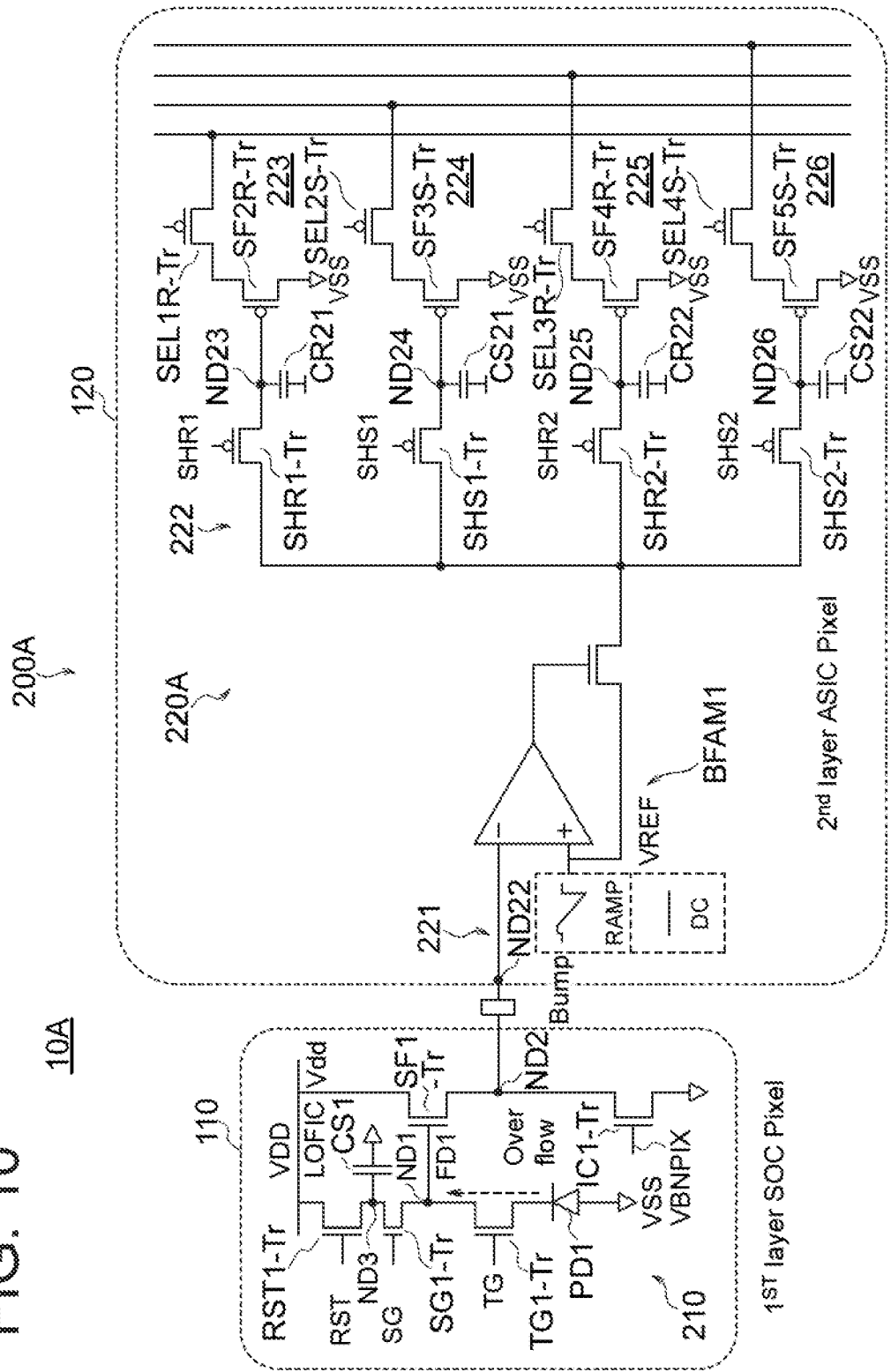
FIG. 10 is a view showing an example of the configuration of a solid-state imaging device according to a second embodiment of the present invention.

FIG. 10 is a view showing an example of the configuration of a pixel of a solid-state imaging device according to a second embodiment of the present invention.

The difference of a solid-state imaging device 10A according to the second embodiment from the solid-state imaging device 10 according to the first embodiment explained above is as follows. In a signal holding part 220A in the solid-state imaging device 10A according to the second embodiment, a buffer amplifier BFAM1 having a comparison function with the reference voltage is connected between the input node MD22 and the first switching transistor SHR1-Tr, second switching transistor SHS1-Tr, third switching transistor SHR2-Tr, and fourth switching transistor SHS2-Tr.

According to the second embodiment, not only can the same effects as the effects by the first embodiment explained above be obtained, but also it becomes possible to raise the speed of and stabilize the read-out processing.

Third Embodiment

Figure 11:
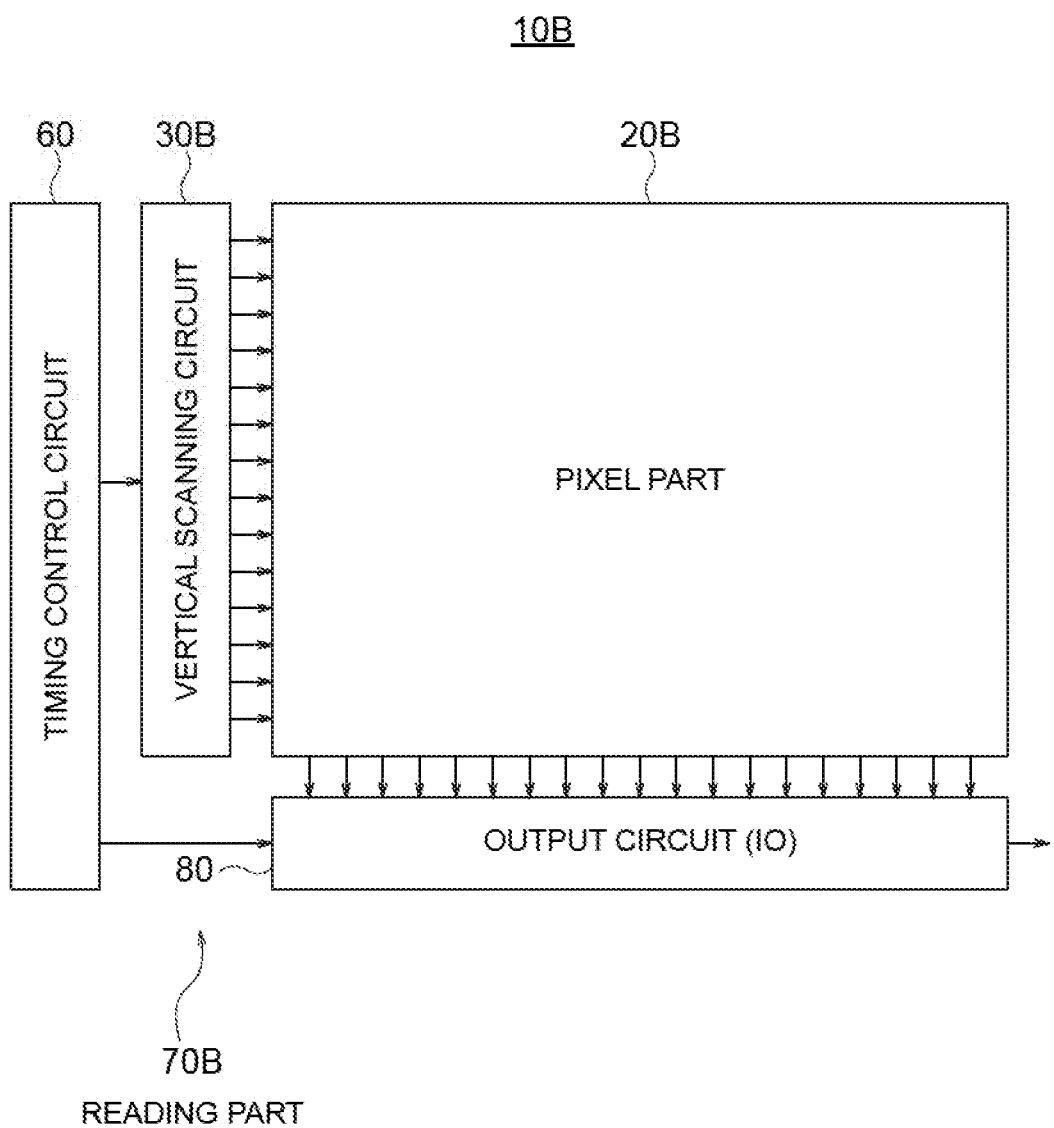
FIG. 11 is a block diagram showing an example of the configuration of a solid-state imaging device according to a third embodiment of the present invention.

FIG. 11 is a block diagram showing an example of the configuration of a solid-state imaging device according to a third embodiment of the present invention. In the present embodiment, a solid-state imaging device 10B is for example configured by a CMOS image sensor including digital pixels as the pixels.

This solid-state imaging device 10B, as shown in FIG. 11, has as principal components an image capturing part of a pixel part 20B, vertical scanning circuit (row scanning circuit) 30B, output circuit 80, and timing control circuit 60. Among these components, for example, the vertical scanning circuit 30B, output circuit 80, and timing control circuit 60 configure a reading part 70B of pixel signals.

In the third embodiment, the solid-state imaging device 10B, in the pixel part 20B, has photoelectric converting and reading parts 210 and signal holding parts 220B as the digital pixels, and the signal holding part 220B is configured as for example a stacked type CMOS image sensor which includes the AD (analog-to-digital) conversion part and memory part and has the operation function of a global shutter. In the solid-state imaging device 10B according to the third embodiment, as will be explained in detail later, each digital pixel DP has an AD conversion function, and the AD conversion part has a comparator which performs comparison processing for comparing the voltage signal read out by the photoelectric converting and reading part with the reference voltage and outputs a digitalized comparison result signal. Further, under the control of the reading part 70B, the comparator performs first comparison processing for outputting a digitalized first comparison result signal with respect to a voltage signal corresponding to the overflow charge overflowing from the photoelectric conversion element to the output node (floating diffusion) in the integration period and second comparison processing for outputting a digitalized second comparison result signal with respect to a voltage signal corresponding to the accumulated charge of the photoelectric conversion element transferred to the output node in the transfer period after the integration period.

Below, an outline of the configurations and functions of the parts in the solid-state imaging device 10B, particularly the configurations and functions of the pixel part 20B and digital pixel, read-out processing concerned with them, and stacked structures of the pixel part 20B and reading part 70B, and the like will be explained in detail.

Configurations of Pixel Part 20B and Digital Pixel 200B

Figure 12:
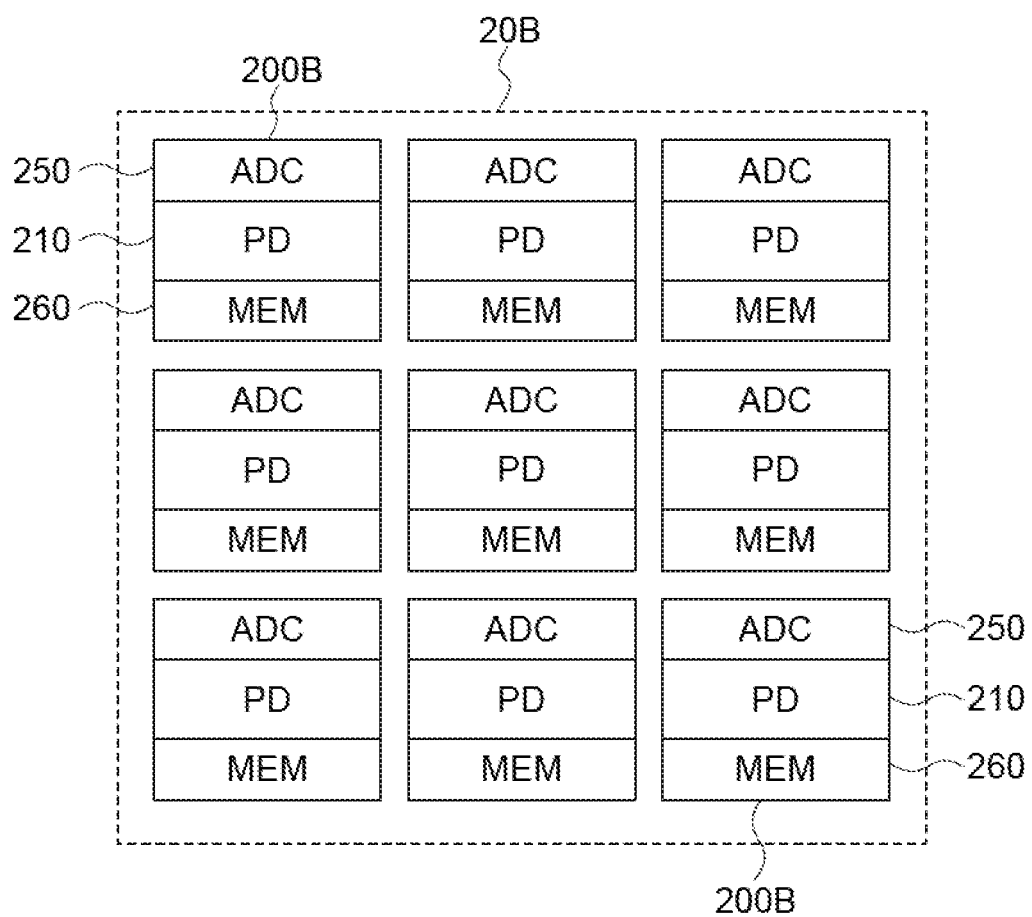
FIG. 12 is a view showing an example of a digital pixel array of the pixel part in the solid-state imaging device according to the third embodiment of the present invention.
Figure 13:
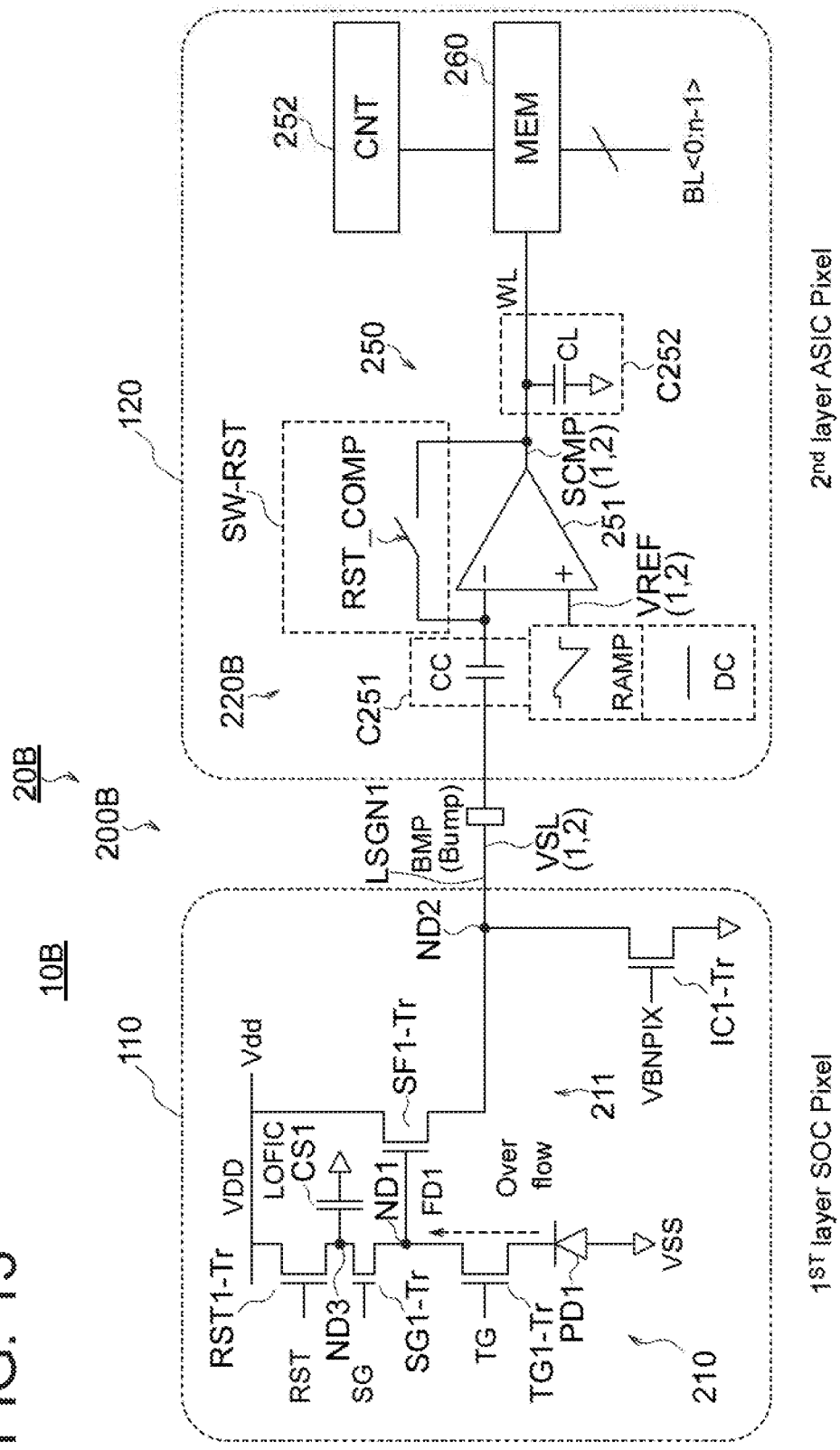
FIG. 13 is a circuit diagram showing an example of s pixel of the solid-state imaging device according to the third embodiment of the present invention.

FIG. 12 is a view showing an example of the digital pixel array of the pixel part in the solid-state imaging device 10B according to the third embodiment of the present invention. FIG. 13 is a circuit diagram showing an example of a pixel of the solid-state imaging device 10B according to the third embodiment of the present invention.

In the pixel part 20B, as shown in FIG. 12, a plurality of digital pixels 200B are arranged in a matrix comprised of N rows and M columns. Note that, FIG. 12, for simplification of the drawing, shows an example in which nine digital pixels 200B are arranged in a matrix comprised of 3 rows and 3 columns (matrix of =3 and N=3).

The digital pixel 200B according to the third embodiment is configured including the photoelectric converting and reading part (described as PD in FIG. 12) 210, AD conversion part (described as ADC in FIG. 12) 250, and memory part (described as M in FIG. 12) 260. The pixel part 20B in the third embodiment, as will be explained in detail later, is configured as a stacked type CMDS image sensor configured by the first substrate 110 and second substrate 120. In the present example, however, as shown in FIG. 13, the photoelectric converting and reading part 210 is formed on the first substrate 110, and the AD conversion part 250 of the signal holding part 220B and the memory part 260 are formed on the second substrate 120.

The photoelectric converting and reading part 210 in the digital pixel 200B has the same configuration as that in FIG. 2. Accordingly, a detailed explanation thereof will be omitted.

Note, the photoelectric converting and reading part 210 according to the third embodiment, in a first comparison processing period PCMPR1 of the AD conversion part 250, outputs a voltage signal VSL corresponding to the overflow charge overflowing from the photoelectric conversion element of the photodiode PD1 to the output node of the floating diffusion FD1 in the integration period PI.

Further, the photoelectric converting and reading part 210, in a second comparison processing period PCMPR2 of the AD conversion part 250, outputs a voltage signal VSL corresponding to the accumulated charge of the photodiode PD1 transferred to the output node of the floating diffusion FD1 in the transfer period after the integration period PI. The photoelectric converting and reading part 210, in the second comparison processing period PCMPR2, outputs the read-out reset signal (signal voltage) (VRST) and read-out signal (signal voltage) (VSIG) as the pixel signals to the AD conversion part 250.

The AD conversion part 250 in the digital pixel 200 has a function of comparing the analog voltage signal VSL output by the photoelectric converting and reading part 210 with the reference voltage VREF of a ramp waveform changed with a predetermined inclination or a fixed voltage and converting the result to a digital signal.

The AD conversion part 250, as shown in FIG. 13, is configured including a comparator (COMP) 251, counter (CNT) 252, input side coupling capacitor C251, output side load capacitor C252, and reset switch SW-RST.

In the comparator 251, the first input terminal of the inverted input terminal (−) is supplied with the voltage signal VSL which was output from the output buffer part 211 of the photoelectric converting and reading part 210 to the signal line LSGN1, while the second input terminal of the non-inverted input terminal (+) is supplied with the reference voltage VREF. The comparator performs comparison processing for comparing the voltage signal VST and the reference voltage VREF and outputting the digitalized comparison result signal SCMP.

In the comparator 251, the coupling capacitor C251 is connected to the first input terminal of the inverted input terminal (−). By AC-coupling of the output buffer part 211 of the photoelectric converting and reading part 210 on the first substrate 110 side and the input part of the comparator 251 in the AD conversion part 250 on the second substrate 120 side, it is possible to lower noise and to realize a high SNR at the time of low light.

Further, in the comparator 251, the reset switch SW-RST is connected between the output terminal and the first input terminal of the inverted input terminal (−), while the load capacitor C252 is connected between the output terminal and the reference potential VSS.

Basically, in the AD conversion part 250, the analog signal (potential VSL) read out from the output buffer part 211 of the photoelectric converting and reading part 210 to the signal line LSGN1 is compared in the comparator 251 with the reference voltage VREF, for example, a ramp signal RAMP with a slope waveform linearly changing with a certain inclination. At this time, a counter 252 which is arranged for each column in the same way as the comparator 251 is operating. Therefore, by the ramp signal RAMP with the ramp waveform and the counter value changing in one-to-one correspondence, the voltage signal VSL is converted to a digital signal. Basically, in the AD conversion part 250, the change of the reference voltage VREF (for example ramp signal RAMP) is conversion of a change of voltage to a change of time. By counting that time in certain cycle (clock), it is converted to a digital value. Further, when the analog signal VSL and the ramp signal RAMP (reference voltage VREF) cross, the output of the comparator 251 inverts and the input clock of the counter 252 is stopped or the clock stopped being input is input to the counter 252. The value (data) of the counter 252 at that time is stored in the memory part 260 to thereby complete the AD conversion. After the end of the above AD conversion period, the data (signal) stored in the memory part 260 in each digital pixel 200B is output from the output circuit 80 to a not shown signal processing circuit, whereupon a two-dimensional image is generated by predetermined signal processing.

First Comparison Processing and Second Comparison Processing in Comparator 251

Further, the comparator 251 in the AD conversion part 250 in the third embodiment is controlled in drive by the reading part 70B so as to perform the following two processings, i.e., the first comparison processing and the second comparison processing, in the reading period of pixel signals.

In the first comparison processing CMPR1, under the control of the reading part 70B, the comparator 251 outputs a digitalized first comparison result signal SCMP1 with respect to a voltage signal VSL1 corresponding to the overflow charge overflowing from the photoelectric conversion element of the photodiode PD1 to the output node of the floating diffusion FD1 in the integration period PI. Note that, the operation of this first comparison processing CMPR1 is a sampling operation of the overflow charge and is also referred to as a "time stamp ADC mode operation".

In the second comparison processing CMPR2, under the control of the reading part 70B, the comparator 251 outputs a digitalized second comparison result signal SCHP2 with respect to a voltage signal VSL2 (VSIG) corresponding to the accumulated charge of the photodiode PD1 transferred to the output node of the floating diffusion FD1 in the transfer period PT after the integration period PI. In actuality, in the second comparison processing CMPR2, before the voltage signal VSL2 (VSIG) corresponding to the accumulated charge is digitalized, then the voltage signal VSL2 (VRRT) corresponding to the reset voltage of the floating diffusion FD1 at the time of resetting is digitalized. Note that, the operation of this second comparison processing CMPR2 is a sampling operation of the accumulated charge and is also referred to as a "linear ADC mode operation".

Note that, in the present embodiment, basically the integration period PI is the period from when the photodiode PD1 and floating diffusion FD1 are reset to the reset level to when the transfer transistor TG1-Tr is switched to a conductive state and the transfer period PT is started. The period PCMPR1 of the first comparison processing CMPR1 is the period after the start of resetting of the photodiode PD1 and floating diffusion FD1 to the reset level up to when the floating diffusion FD1 is reset to the reset level before the start of the transfer period PT. The period PCMPR2 of the second comparison processing CMPR2 is the period after the reset of the floating diffusion FD1 to the reset level and is the period including the transfer period PT and following period.

Figure 14:
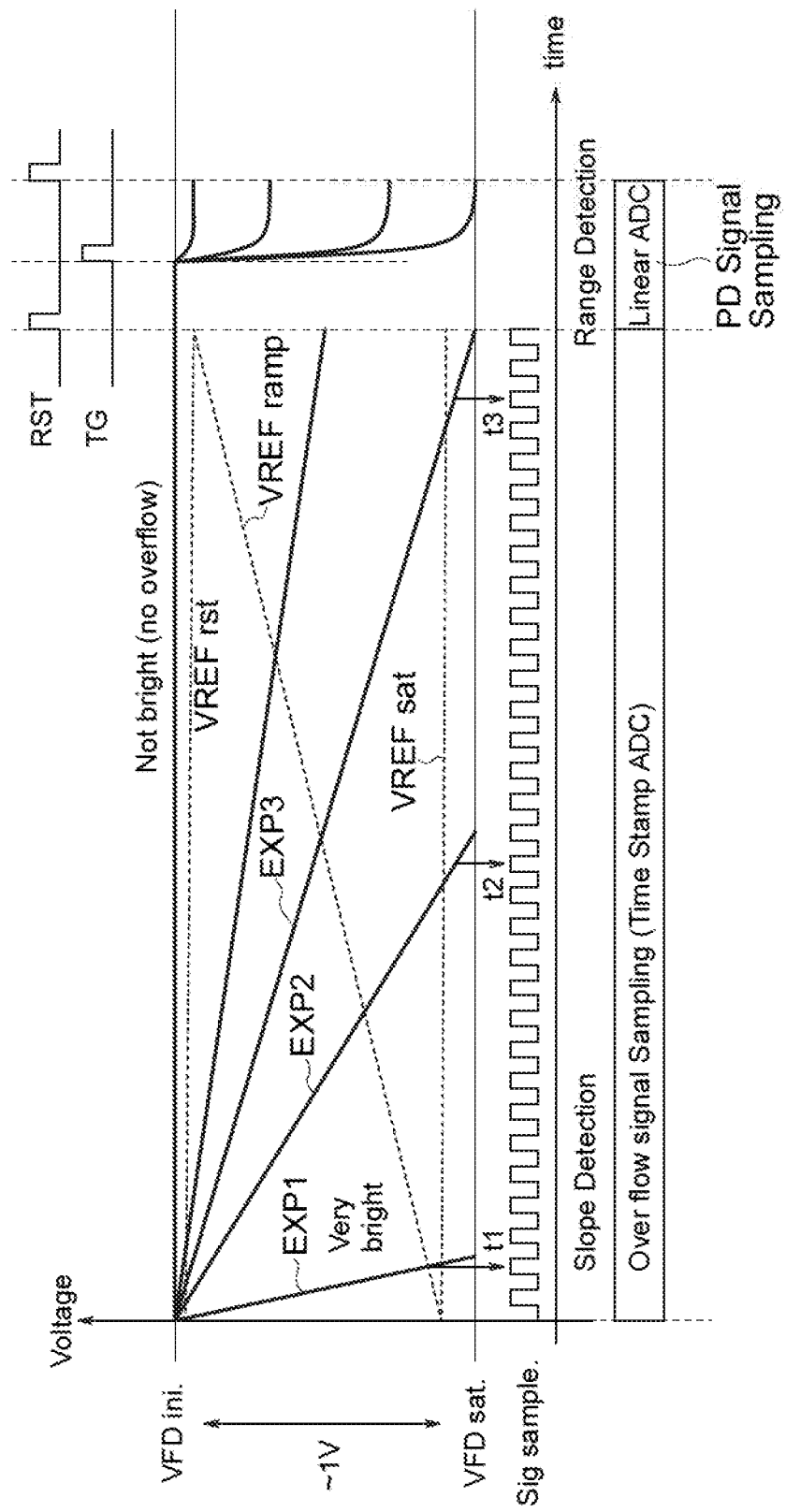
FIG. 14 is a view for explaining a first comparison processing of a comparator according to the third embodiment.

Here, the first comparison processing CMPR1 will be further explained in detail. FIG. 14 is a view for explaining the first comparison processing CMPR1 of the comparator 251 according to the present embodiment. In FIG. 14, an abscissa indicates the time, and an ordinate indicates the voltage level VFD of the output node of the floating diffusion FD1.

Looking at the voltage level VFD of the floating diffusion FD1, at the time of the reset level, the quantity of charge is the smallest and the voltage level VFD becomes the highest level VFDini. On the other hand, at the time of the saturation state, the quantity of charge is the largest and the voltage level VID becomes a low level VFDsat. According to such conditions, the reference voltage VREF1 of the comparator 251 is set to a voltage VREFsat which is fixed to the level at the time of the non-saturation state before the saturation state or is set to a ramp voltage VREFramp changing from a voltage level VREFrst at the time of reset level up to the voltage level VREFsat.

If such a reference voltage VREF1 is set at VREFsat or VREFramp at the time of the first comparison processing CPR1, as shown in FIG. 14, at the time of high light when the strength of the incident light is high, the quantity of charge is larger, therefore the time of flipping (inversion) of the output of the comparator 251 is fast. In a case of example EXP1 of the highest light, the output of the comparator 251 immediately flips (inverts) at the time t1. In a case of example EXP2 of light lower than that in example EXP1, the output of the comparator 251 flips (inverts) at the time t2 later than the time t1. In a case of example EXP3 of a light lower than that in example EXP2, the output of the comparator 251 flips (inverts) at the time t3 later than the time t2.

In this way, in the first comparison processing CMPR1, the comparator 251 outputs the first comparison result signal SCMP1 with respect to the time corresponding to the quantity of overflow charge from the photodiode PD1 to the floating diffusion FD1 for a predetermined time period in the integration period PI.

More specifically, in the first comparison processing CPR1, the comparator 251 can handle comparison processing with a light level from a signal level corresponding to a predetermined threshold value of the photodiode PD1 at the maximum sampling time at which the overflow charge begins to overflow from the photodiode PD1 to the output node of the floating diffusion FD1 to the signal level obtained at the minimum sampling time.

As explained above, the photo conversion operation in the time stamp ADC mode is executed in the integration period PI accompanied by light-to-time conversion. As shown in FIG. 14, under a very bright light, the output state of the comparator 251 is inverted immediately after the reset activation period, and the light level thereof corresponds to the saturation signal (well capacity) explained by the following time:

((FD saturation amount×integration time)/sampling period)+PD saturation amount

For example, assume that FD saturation: 8 Ke@150 uV/e to 1.1 fF of FD capacity, minimum sampling time: 15 nsec, and integration time: 3 msec.

In this time stamp ADC operation mode, as explained above, it is possible to cover the light level from a signal level corresponding to the predetermined threshold value of the photodiode PD1 at the maximum sampling time at which the overflow charge begins to overflow from the photodiode PD1 to the output node of the floating diffusion FD1 to a signal level obtained at the minimum sampling time.

Figure 15:
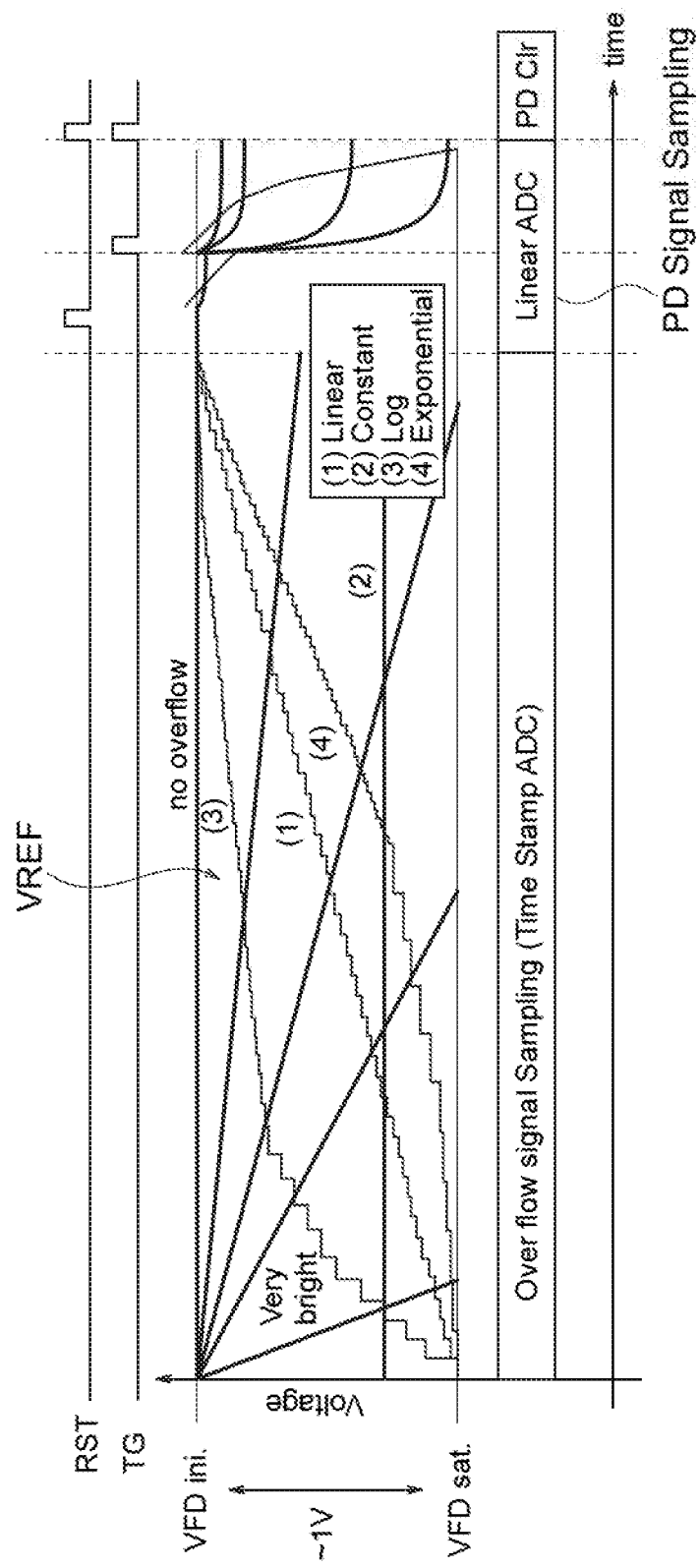
FIG. 15 is a view for explaining the first comparison processing of the comparator according to the third embodiment and for explaining an example of another pattern of a reference voltage.

FIG. 15 is a view for explaining the first comparison processing CMPR1 of the comparator 251 according to the present embodiment and explaining an example of another pattern of the reference voltage.

The reference voltage VREF may be a ramp waveform (signal) RAMP changing with a predetermined inclination as indicated by (1) in FIG. 15 or a fixed voltage DC indicated by (2) in FIG. 15 as well. Further, it may be a log indicated by (3) in FIG. 15 or a voltage signal taking an exponential value indicated by (4) in FIG. 15 as well.

Figure 16:
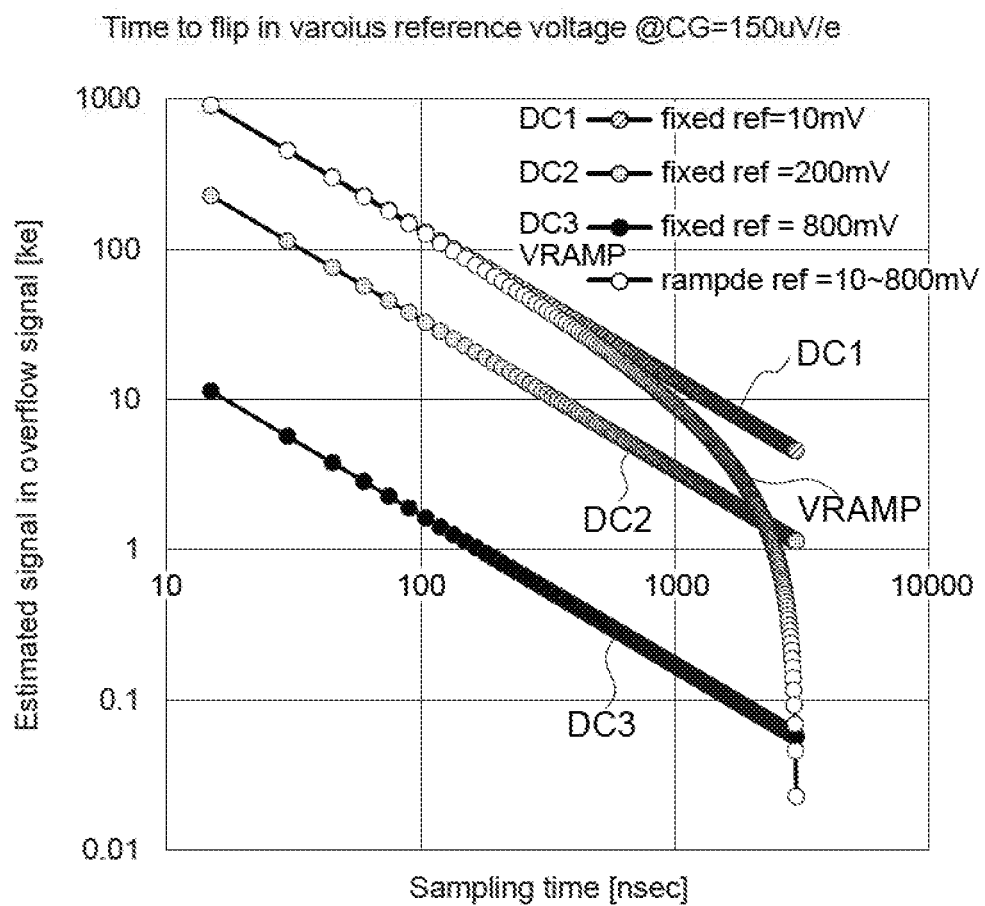
FIG. 16 is a view showing a state of light-to-time conversion where various reference voltages are input to the comparator according to the third embodiment of the present invention.

FIG. 16 is a view showing states of light-to-time conversion where various reference voltages VREF are input to the comparator according to the present embodiment. In FIG. 16, an abscissa indicates the sampling time, and an ordinate indicates the estimated signal in the overflow signal. Note that, the overflow signal referred to here is estimated by rendering the transfer transistor TG1-Tr the conductive state to set a condition where the charge is not accumulated in the photodiodes PD1 (non-overflow).

FIG. 16 shows a sampling time at which the comparator 251 inverts which corresponds to the overflow charge (signal) according to the nature (suitability) of the light applied. FIG. 16 shows the sampling time which inverts for a variety of fixed reference voltages DC1, DC2, and D3 and the ramp reference voltage VRAMP. Here, use is made of a linear reference ramp.

When the operation of the time stamp ADC mode for performing the first comparison processing CMPR1 with respect to the saturated overflow charge as described above ends, after resetting the floating diffusion FD1 and comparator 251, the processing shifts to the operation of the linear ADC mode for performing the second comparison processing CMPR2 with respect to the non-saturated charge.

Figure 17:
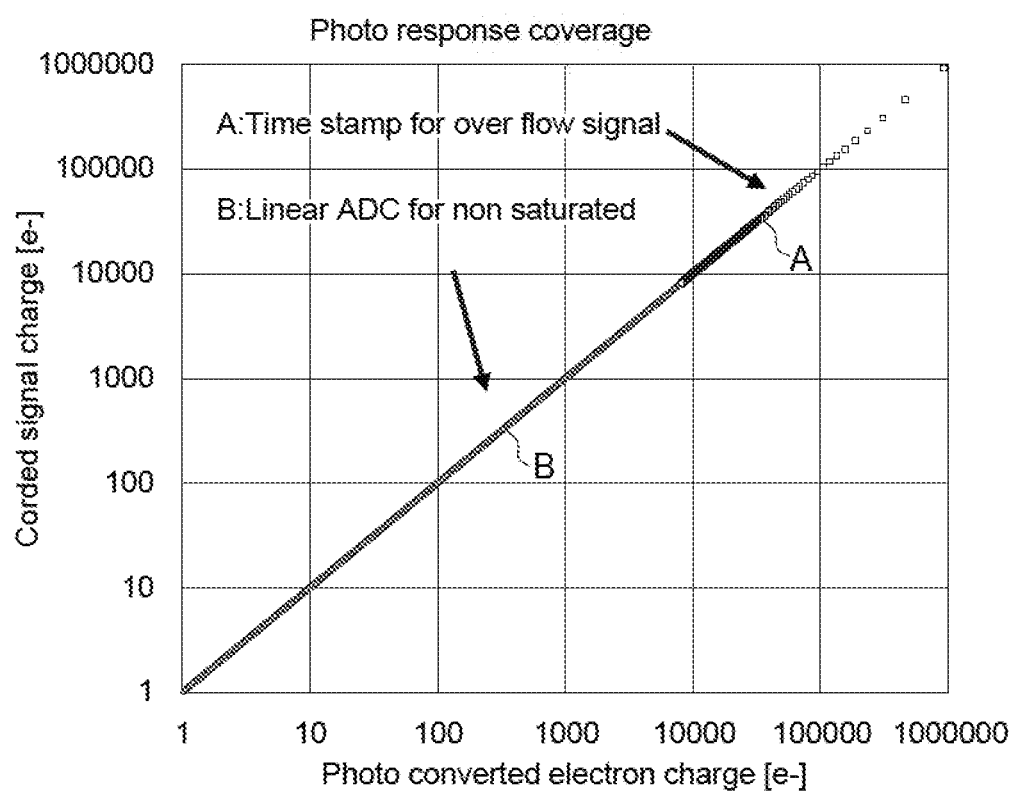
FIG. 17 is a view showing a photo-response coverage in the digital pixel according to the third embodiment of the present invention.

FIG. 17 is a view showing a photo response coverage in the digital pixel according to the third embodiment of the present invention. In FIG. 17, A indicates the signal according to the time stamp ADC mode operation performing the first comparison processing CMPR1 of the time overflow charge from the start of the integration period PI or skimming the overflow charge in the integration period PI, and B indicates the signal according to the linear ADC mode operation performing the second comparison processing CMPR2 with respect to the accumulated charge.

The time stamp ADC mode has a photo response with respect to very bright light, therefore the linear ADC mode can have a photo response from a dark level. For example, a dynamic range performance of 120 dB can be realized. For example, as explained above, the saturation signal of the photo conversion range is 900 Ke. The linear ADC mode is a usual reading mode operation to which ADC is applied, therefore can cover from a noise level of 2e up to the saturation of the photodiode PD1 and floating diffusion FD1 of 8 Ke. The coverage of the linear ADC mode can be expanded to 30 Ke by an additional switch and capacity.

Figure 18:
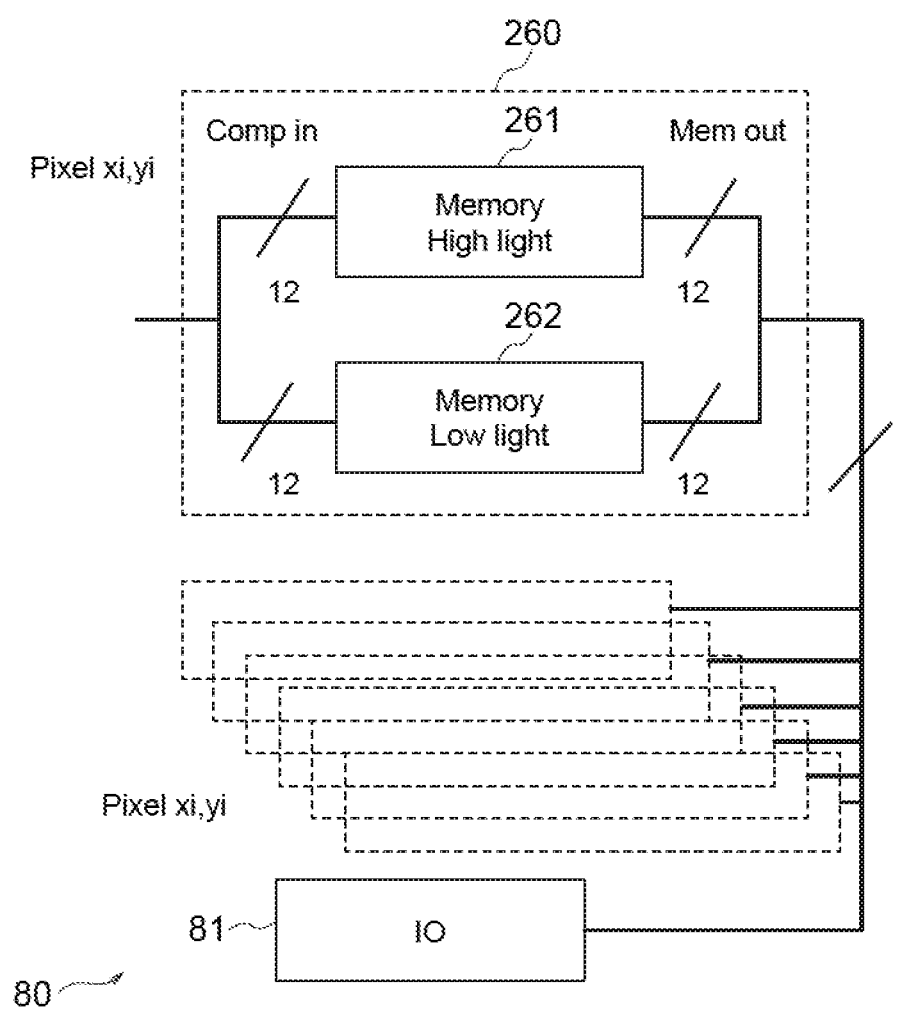
FIG. 18 is a view showing an example of configurations of a memory part and output circuit according to the third embodiment of the present invention.

FIG. 18 is a view showing an example of the configuration of a memory part and output circuit according to the third embodiment of the present invention.

In the comparator 251, the first comparison result signal SCMP1 obtained by digitalization of the voltage signal corresponding to the overflow charge of the floating diffusion FD1 by the first comparison processing CMPR1 and the second comparison result signal SCMP2 obtained by digitalization of the accumulated charge in the photodiode PD1 by the second comparison processing CMPR2 are stored as digital data in the memories 261 and 262 linked with each other. The memory part 260 is configured by an SRAM or DRAM, and the digital-converted signal is supplied to this. The signal corresponds to the photo conversion code and can be read out by an external IO buffer 81 of the output circuit 80 on the periphery of the pixel array.

FIG. 19 is a view showing an example of the frame read out sequence in the solid-state imaging device 10 according to the third embodiment of the present invention. Here, an example of the frame read-out method in the solid-state imaging device 10B will be explained. In FIG. 19, TS indicates the processing time of the time stamp ADC, and Lin indicates the processing period of the linear ADC.

As explained above, the overflow charge is accumulated in the floating diffusion FD1 in the integration period PI. The time stamp ADC mode operates in the integration period PI. In actuality, the time stamp ADC mode operates for a period in the integration period PI up to the reset of the floating diffusion FD1. When the operation of the time stamp ADC mode ends, the operation shifts to the linear ADC mode where conversion is carried out so as to read the signal (VRST) at the time of reset of the floating diffusion FD1 and store the digital signal in the memory part 260. Further, after the end of the integration period PI, in the linear ADC mode, conversion is carried out so as to read the signal (VSIG) in accordance with the accumulated charge of the photodiode PD1 and store the digital signal in the memory part 260. The read-out frame is output by reading the digital signal data from the memory node and is sent through a buffer which has such an MIPI data format, for example, an IO buffer 81 of the output circuit 80 (FIG. 18), to the outside of the solid-state imaging device 10 (image sensor). This operation can be globally executed with respect to the entire pixel array.

Further, in the pixel part 20, the reset transistors RST1-Tr and transfer transistors TG1-Tr are used to reset the photodiodes PD1 simultaneously for all of the pixels to thereby start the exposure for all of the pixels simultaneously and in parallel. Further, after the predetermined exposure period (integration period PI) ends, the transfer transistors TG1-Tr are used to sample the output signals 210 from the photoelectric converting and reading parts at the AD conversion parts 250 and memory parts 260 to thereby end the exposure simultaneously and in parallel for all pixels. Due to this, a global shutter operation is realized electronically.

The vertical scanning circuit 30B drives the photoelectric converting and reading parts 210 in the digital pixels 200 through the row scanning control line in the shutter rows and read rows under the control of the timing control circuit 60. Under the control of the timing control circuit 60, the vertical scanning circuit 30B supplies reference voltages VREF1 and VREF2 set according to the first comparison processing CMPR1 and second comparison processing CMPR2 to the comparators 251 in the digital pixels 200. Further, the vertical scanning circuit 30B, according to the address signals, outputs the row selection signals of row addresses of the read row for reading of the signal and the shutter row for resetting the charges accumulated in the photodiodes PD1.

The output circuit 80, for example, as shown in FIG. 18, includes the IO buffer 81 arranged corresponding to the memory output of each digital pixel 200B in the pixel part 20B and outputs the digital data read out from each digital pixel 200B to the outside.

The timing control circuit 60 generates timing signals necessary for signal processing of the pixel part 20B, vertical scanning circuit 30B, output circuit 80, and the like.

In the third embodiment, for example, at the time of global shutter node, the reading part 70B performs the read-out control of the pixel signals from the digital pixels 200B.

Stacked Structure of Solid-State Imaging Device 10B

Next, the stacked structure of the solid-state imaging device 10B according to the third embodiment will be explained.

Figure 21:
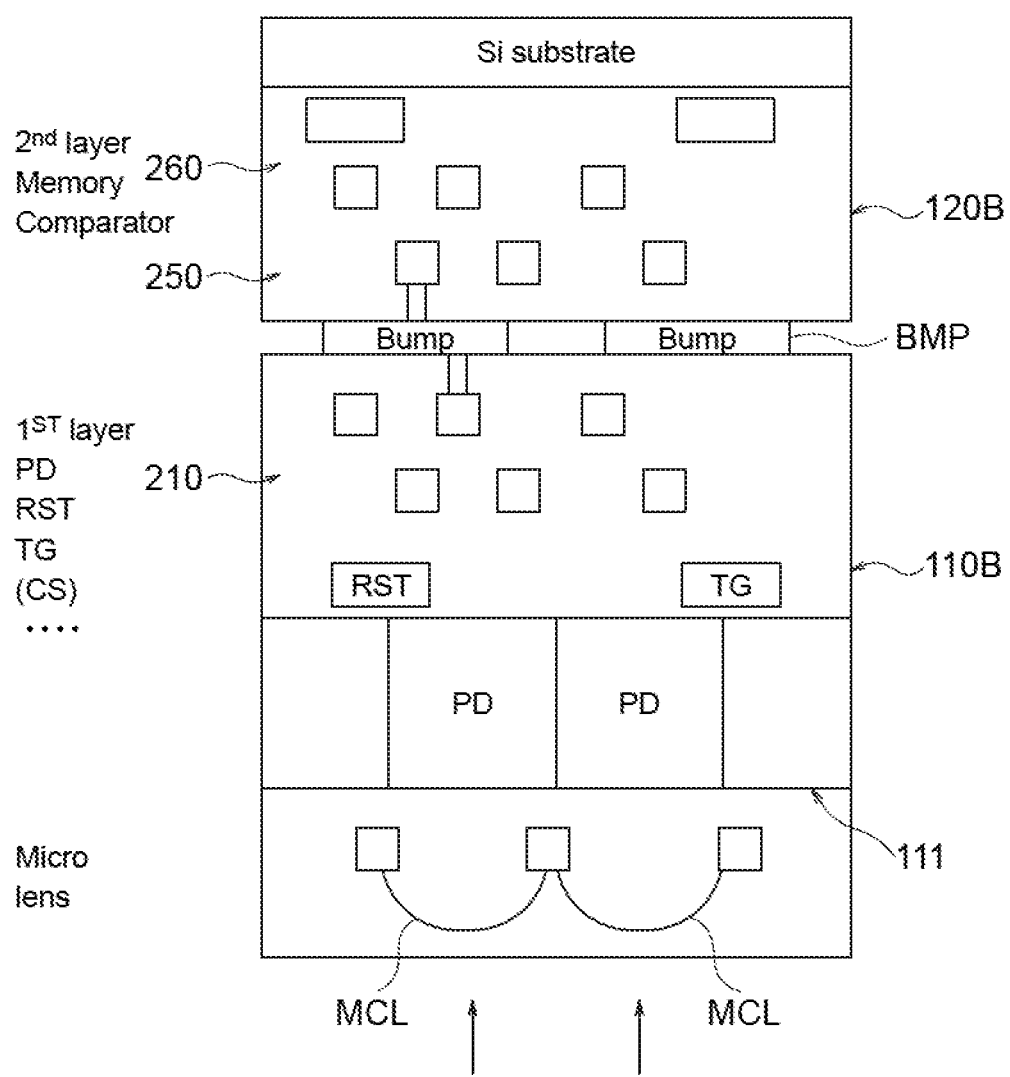
FIG. 21 is a schematic cross-sectional view for explaining a stacked structure of the solid-state imaging device according to the third embodiment.

FIG. 20A and FIG. 20B are schematic views for explaining the stacked structure of the solid-state imaging device 10B according to the third embodiment. FIG. 21 is also a schematic cross-sectional view for explaining the stacked structure of the solid-state imaging device 10B according to the third embodiment.

The solid-state imaging device 10B according to the third embodiment has a stacked structure of a first substrate (upper substrate) 110B and a second substrate (lower substrate) 120B. The solid-state imaging device 10 is for example formed as an image capturing device having a stacked structure obtained by bonding the substrates to each other at a wafer level and cutting them by dicing. In the present example, the device is structured with the first substrate 110B stacked on the second substrate 120B.

On the first substrate 110B, photoelectric converting and reading parts 210 of the digital pixels 200B in the pixel part 20B are formed centered about its center part. The photodiodes PD are formed on the first surface 111 side of the first substrate 110B upon which the light L is incident. A microlens MCL and color filter are formed on that light incident side. On the second surface side of the first substrate 110B, the transfer transistors TG1-Tr, reset transistors RST1-Tr, source follower transistors SF1-Tr, current transistors IC1-Tr, storage transistors SG1-Tr, and storage capacitors CS1 are formed.

In this way, in the third embodiment, basically the photoelectric converting and reading parts 210 in the digital pixels 200B are formed in a matrix on the first substrate 110B.

AD conversion parts 250 and memory parts 260 in the digital pixels 200B are formed in a matrix on the second substrate 120B. Further, the vertical scanning circuit 30B, output circuit 80, and timing control circuit 60 may be formed on the second substrate 120B as well.

In such a stacked structure, the read-out node ND2 of each photoelectric converting and reading part 210 on the first substrate 110B and the inverted input terminal (−) of the comparator 251 in each digital pixel 200B on the second substrate 120B are, for example, as shown in FIG. 13, electrically connected by using the signal line LSGN1, micro-bumps BMP, and vias (die-to-die vias) etc. Further, in the present embodiment, the read-out node ND2 of each photoelectric converting and reading part 210 on the first substrate 110B and the inverted input terminal (−) of the comparator 251 in each digital pixel 200B on the second substrate 120B are AC-coupled by the coupling capacitor C251.

Readout Operation of Solid-State Imaging Device 10B

The characteristic configurations and functions of the parts in the solid-state imaging device 10B were explained above. Next, an outline of the reading operation etc. of pixel signals of the digital pixels 200B in the solid-state imaging device 10B according to the third embodiment will be explained. Below, an outline of a first reading method RDO1, second reading method RDO2, and third reading method RDO3 will be explained.

The first reading method RDO1 is the method for performing the first comparison processing CMPR1 with respect to the overflow charge from the start of the integration period PI. The second reading method RDO2 is the method for performing the first comparison processing CMPR1 by skimming the overflow charge in the integration period PI. The third reading method RDO3 is the method for performing first comparison processing CMPR1 by skimming the overflow charge in the integration period PI and then performing the second comparison processing CMPR2.

First Reading Method RDO1

FIG. 22A to FIG. 22E are views showing operation sequences and potential transitions for mainly explaining the first reading operation in the pixel part at the time of a predetermined shutter mode in the solid-state imaging device according to the third embodiment. FIG. 23A to FIG. 23D are timing charts for mainly explaining the first reading operation in the pixel part at the time of a predetermined shutter mode in the solid-state imaging device according to the third embodiment.

In the first reading method RDO1, the storage transistor SG1-Tr is rendered the conductive state to perform sampling of the reset state and perform the reading operation of the voltage signal corresponding to the overflow charge from the start of the integration period PI of the charges in the photodiodes PD1. Further, after the end of the integration period PI, the voltage signal corresponding to the accumulated charges in the photodiodes PD1 is read out.

As the operation sequence, first, the transfer transistors TG1-Tr, storage transistors SG1-Tr, and reset transistors RST1-Tr are rendered a conductive state to perform a so-called global reset. Next, the read-out reset signals concerned with the storage capacitors CS1 are sampled. Further, the read-out signals corresponding to the read-out reset signals are sampled. Next, the read-out reset signals concerned with the floating diffusions FD1 are sampled. Further, the read-out signals corresponding to the read-out reset signals are sampled.

Second Reading Method RDO2

Figure 27:
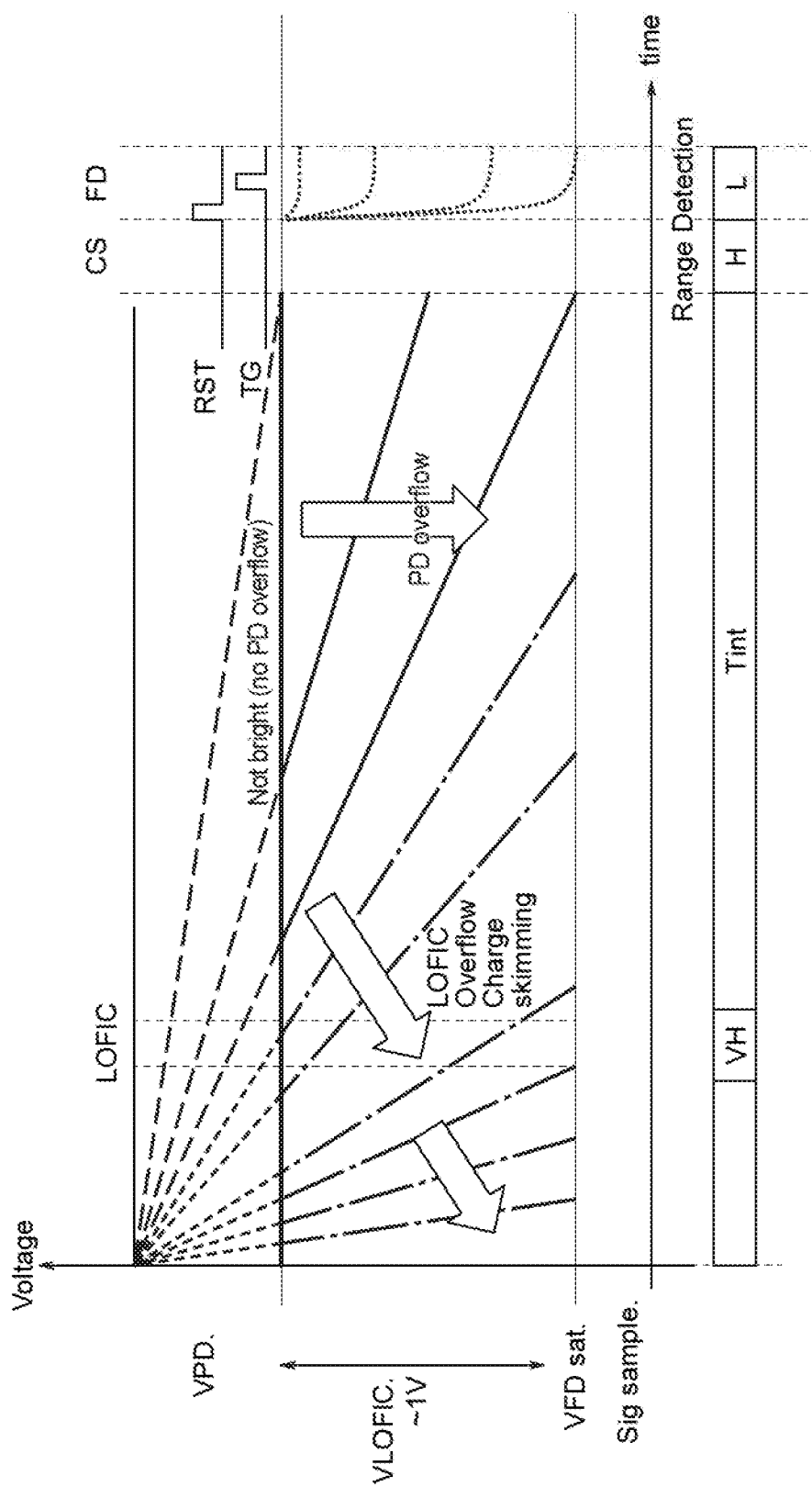
FIG. 27 is a view schematically showing an example of processing for skimming an overflow charge in the middle of the integration period in the second reading method.
Figure 28:
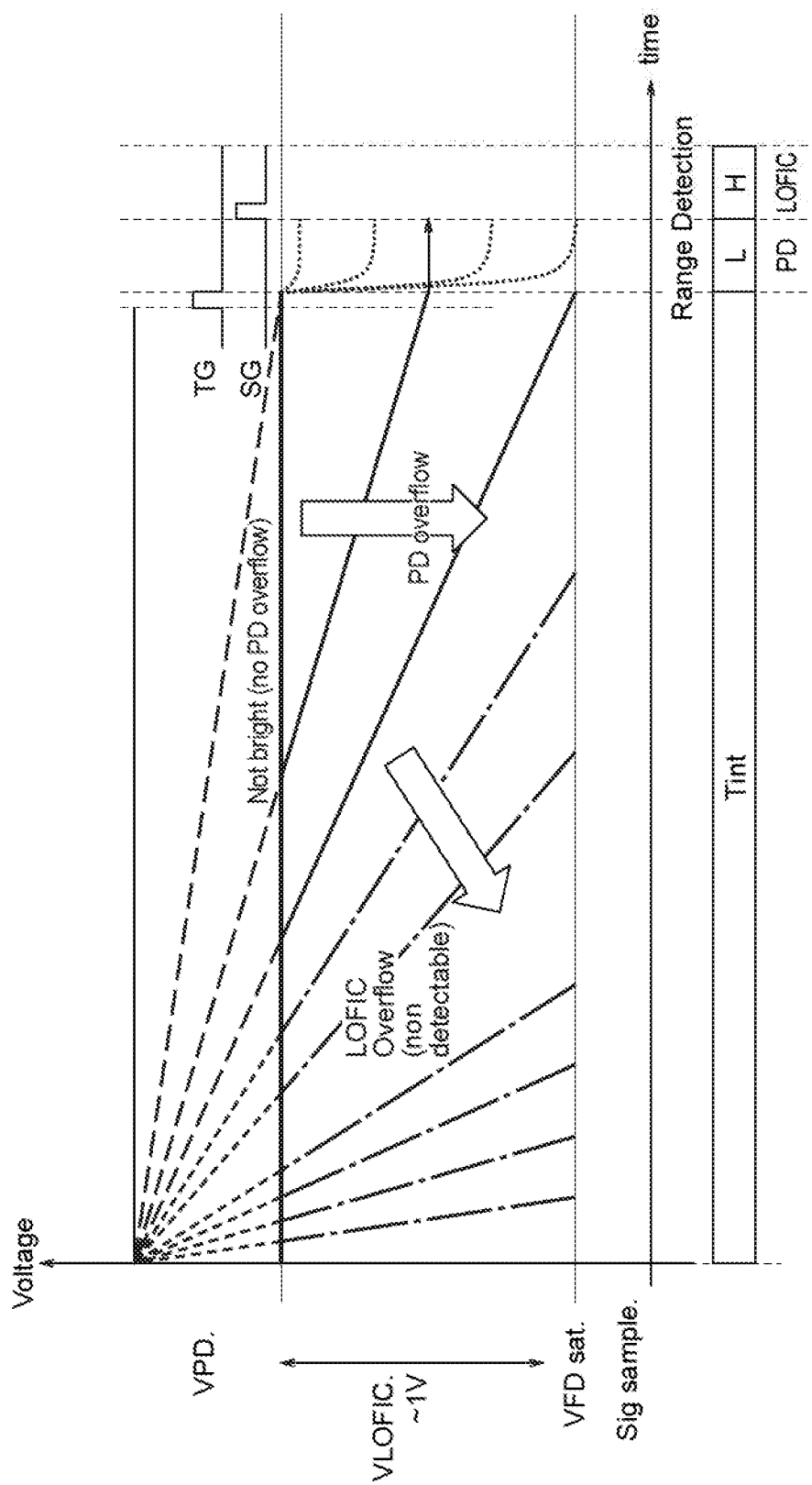
FIG. 28 is a view schematically showing a situation of overflow of the charge from a photodiode and further overflow to a storage capacitor side.

FIG. 24 is a view showing an example of the frame read out sequence of the second reading method in the solid-state imaging device according to the third embodiment of the present invention. FIG. 25A to FIG. 25H are views showing operation sequences and potential transitions for mainly explaining the second reading operation in the pixel part at the time of predetermined shutter mode in the solid-state imaging device according to the third embodiment. FIG. 26A to FIG. 26D are timing charts for mainly explaining the second reading operation in the pixel part at the time of a predetermined shutter mode in the solid-state imaging device according to the third embodiment. FIG. 27 is a view schematically showing an example of the processing of skimming the overflow charge in the middle of the integration period in the second reading method. FIG. 28 is a view schematically showing a situation of overflowing of a charge from a photodiode and further overflowing to the storage capacitor CS1 side.

In the second reading method RDO2, as shown in FIG. 27 and FIG. 28, a case where the charge overflows from the photodiode PD1 to the floating diffusion FD1 and further overflows to the storage capacitor CS1 side is assumed and skimming of the overflow charge is carried out in the middle of the integration period.

As the operation sequence, first, the transfer transistors TG1-Tr, storage transistors SG1-Tr, and reset transistors RST1-Tr are rendered a conductive state to perform a so-called global reset. The integration period PI is started, and the signals before the saturation of the photodiodes PD1 concerned with the floating diffusions FD1 are read out in the integration period PI1. Next, in the integration period PI, after the saturation of the photodiodes PD1 concerned with the floating diffusions FD1, the signals before saturation of the storage capacitor CS1 side are read out. Next, the floating diffusions FD1 are reset. Next, the transfer transistors TG1-Tr are rendered to a conductive state for a predetermined term, and the accumulated charges are transferred to the floating diffusions FD1. Next, sampling of the read-out signals concerned with the floating diffusions FD1 is carried out. Further, sampling of the read-out signals concerned with the storage capacitors CS1 is carried out.

Third Reading Method RDO3

Figure 31:
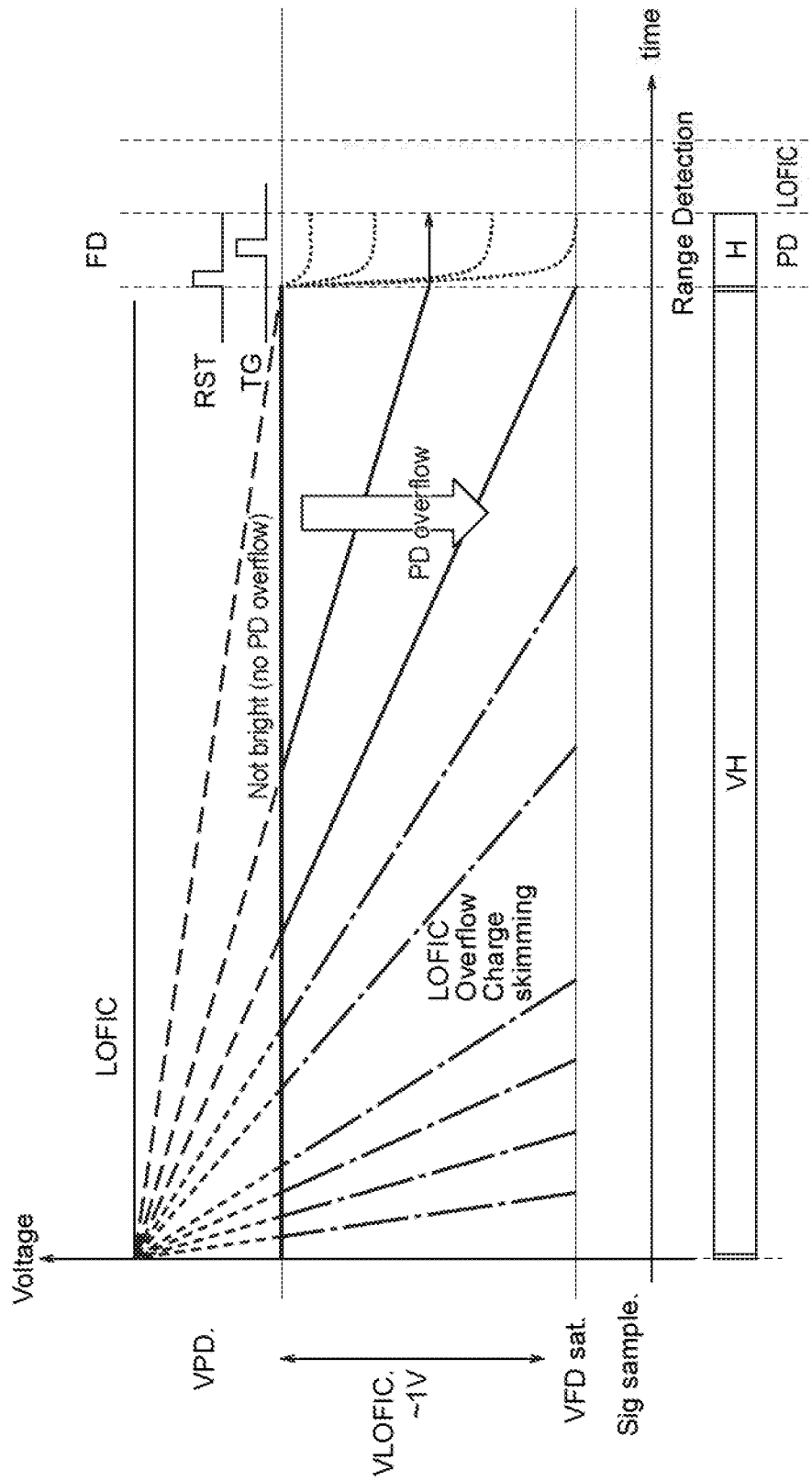
FIG. 31 is a view schematically showing an example of processing for skimming the overflow charge in the middle of the integration period in the third reading method.

FIG. 29 is a view showing an example of the frame read out sequence of the third reading method in the solid-state imaging device according to the third embodiment of the present invention. FIG. 30A to FIG. 30H are views showing operation sequences and potential transitions for mainly explaining the third reading operation in the pixel part at the time of a predetermined shutter mode in the solid-state imaging device according to the third embodiment. FIG. 31 is a view schematically showing an example of the processing of skimming the overflow charge in the middle of the integration period in the third reading method.

In the third reading method RDO3, throughout the integration period PI, levels of the output node in accordance with the light intensity are sampled while changing the reference voltage VREF.

As the operation sequence, first, the transfer transistors TG1-Tr, storage transistors SG1-Tr, and reset transistors RST1-Tr are rendered a conductive state to perform a so-called global reset. Next, sampling of the read-out reset signals concerned with the storage capacitor CS1 is carried out. Further, sampling of the read-out reset signals before saturation of the photodiodes PD1 and after the saturation is carried out. Next, sampling of the read-out signals corresponding to the read-out reset signals before the saturation of the photodiodes PD1 is carried out. Next, sampling of the read-out signals corresponding to the read-out reset signals after the saturation of the photodiodes PD1 is carried out.

As explained above, according to the third embodiment, the solid-state imaging device 10B is configured as for example a stacked type CMDS image sensor which, in the pixel part 20B, includes, as the digital pixels, the photoelectric converting and reading parts 210, AD conversion parts 250, and memory parts 260 and has a global shutter operation function. In the solid-state imaging device 10B according to the third embodiment of the present invention, each digital pixel 200 has the AD conversion function, and the AD conversion part 250B has the comparator 251 for performing comparison processing for comparing the voltage signal read out by the photoelectric converting and reading part 210 with the reference voltage and outputting the digitalized comparison result signal. Further, under the control of the reading part 70B, the comparator 251 performs the first comparison processing CMPR1 outputting the digitalized first comparison result signal SCMP1 with respect to a voltage signal corresponding to the overflow charge overflowing from the photodiode PD1 to the output node (floating diffusion FD1) FD1 in the integration period and the second comparison processing CMPR2 outputting the digitalized second comparison result signal SCMP2 with respect to a voltage signal corresponding to the accumulated charge of the photodiode PD1 transferred to the floating diffusion FD1 (output node) in the transfer period after the integration period.

In the solid-state imaging device 10B according to the third embodiment, in the first reading method RDO1, the first comparison processing CPR1 is carried out with respect to the overflow charge from the start of the integration period PI. In the second reading method RDO2, skimming of the overflow charge is carried out in the integration period PI to perform the first comparison processing CMPR1. In the third reading method RDO3, throughout the integration period PI, skimming of the overflow charge is carried out in the integration period PI while changing the reference voltage VREF to perform the first comparison processing CMPR1 and then perform the second comparison processing CMPR2.

Accordingly, according to the solid-state imaging device 10B of the third embodiment, the charges overflowing from the photodiodes in the integration period are utilized in real time, therefore it becomes possible to realize a broader dynamic range and higher frame rate. Further, according to the third embodiment, it is possible to substantially realize a broader dynamic range and higher frame rate and in addition is possible to lower noise, possible to expand the effective pixel region to the maximum limit, and possible to raise the value relative to the cost to the maximum limit.

Further, according to the solid-state imaging device 10B of the third embodiment, it is possible to prevent complication of the configuration while preventing a drop in the area efficiency in layout.

Further, the solid-state imaging device 10B according to the third embodiment has a stacked structure of the first substrate (upper substrate) 110B and second substrate (lower substrate) 120B. Accordingly, in the third embodiment, by forming the first substrate 110B side basically by only NMOS system elements and expanding the effective pixel region to the maximum limit by the pixel array, the value relative to the cost can be raised to the maximum limit.

Fourth Embodiment

Figure 32:
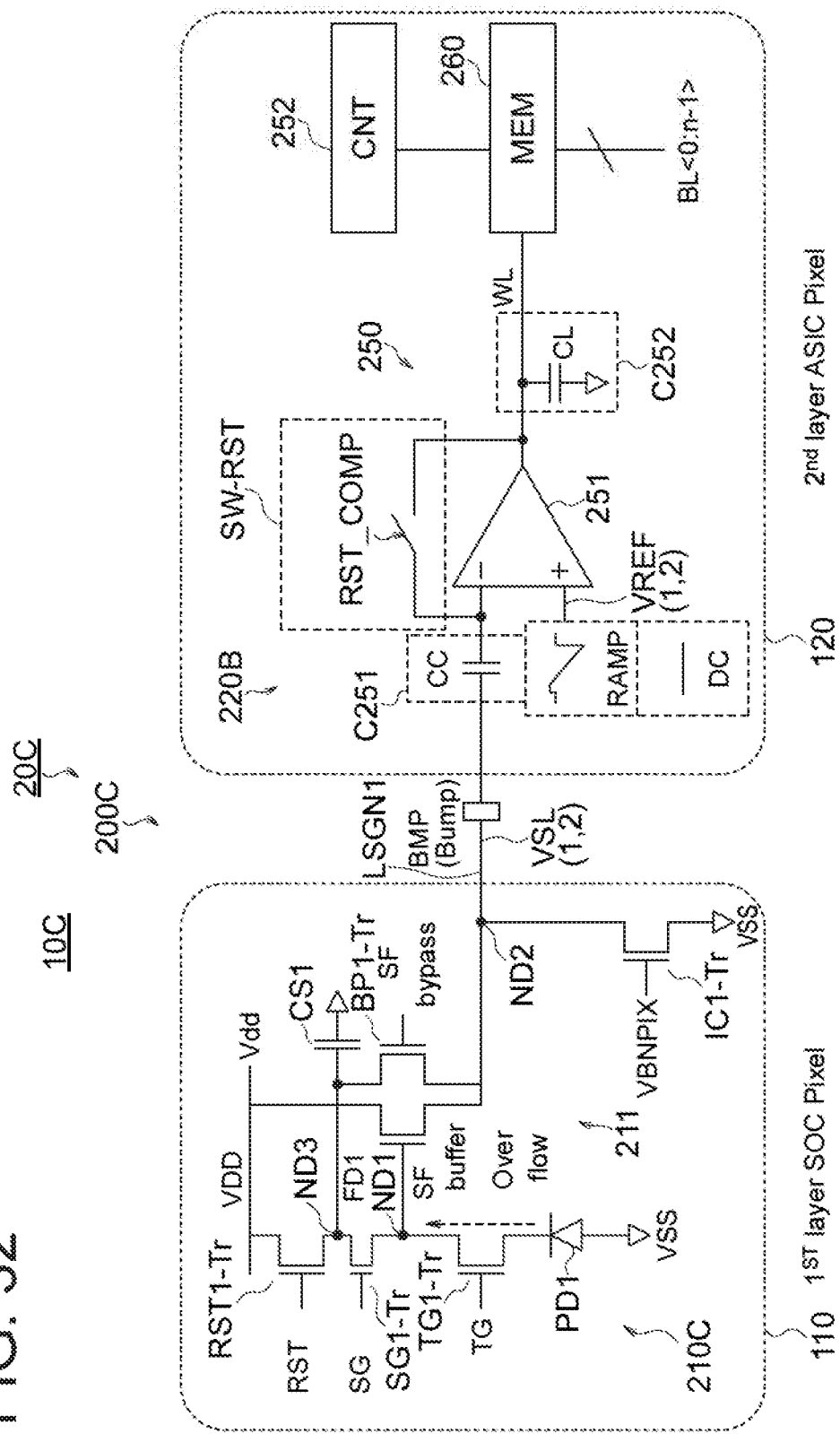
FIG. 32 is a view showing an example of the configuration of a pixel in a solid-state imaging device according to a fourth embodiment of the present invention.

FIG. 32 is a view showing an example of the configuration of a solid-state imaging device according to a fourth embodiment of the present invention.

The difference of a solid-state imaging device 10C according to the fourth embodiment from the solid-state imaging device 10B according to the third embodiment explained above is as follows. In a photoelectric converting and reading part 210C of the solid-state imaging device 10C according to the fourth embodiment, provision is made of a bypass part of a bypass transistor BP1-Tr which bypasses the source follower transistor SF1-Tr at the time of signal sampling in the integration period to directly connect the storage capacitor CS1 to the read-out node ND2 side. Due to this, the capacity component of the storage capacity element of the storage capacitor CS1 can be directly input to the comparator 251.

According to the fourth embodiment, not only can the same effects as the effects by the third embodiment explained above be obtained, but also the power consumption can be suppressed while signals can be sampled while changing the reference voltage VREF throughout the integration period, therefore it becomes possible to realize a further broader dynamic range and higher frame rate.

The solid-state imaging devices 10, 10A, 10B, and 10C explained above can be applied, as image capturing devices, to digital cameras, video cameras, portable terminals, or monitoring cameras, cameras for medical endoscopes, and other electronic apparatuses.

Figure 33:
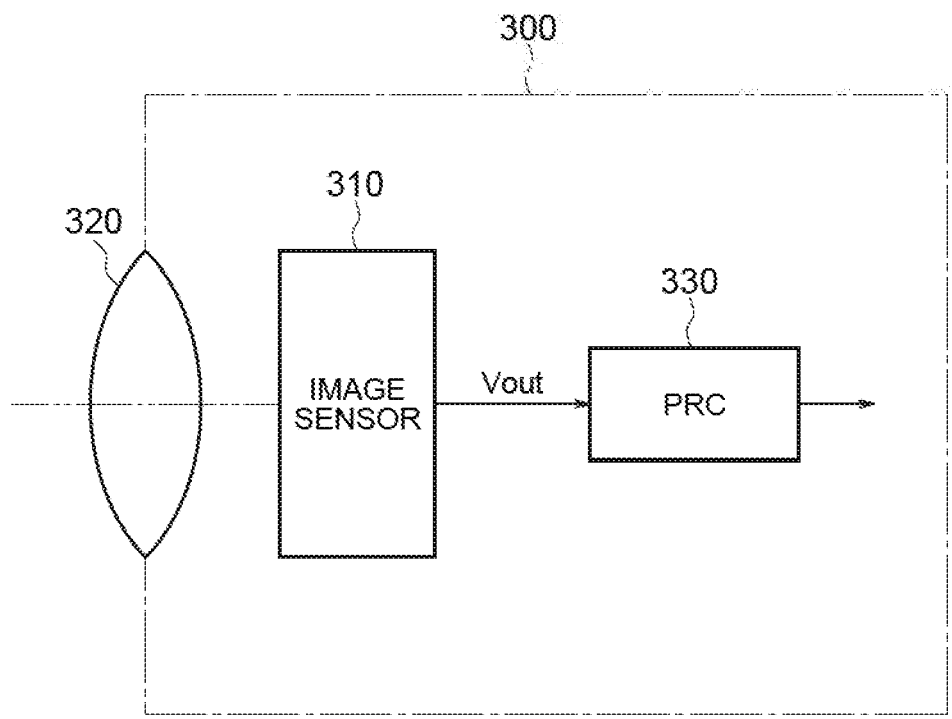
FIG. 33 is a view showing an example of the configuration of an electronic apparatus to which the solid-state imaging device according to an embodiment of the present invention is applied.

FIG. 33 is a view showing an example of the configuration of an electronic apparatus mounting a camera system to which the solid-state imaging device according to an embodiment of the present invention is applied.

The electronic apparatus 300, as shown in FIG. 33, has a CMOS image sensor 310 to which the solid-state imaging device 10 according to the present embodiment can be applied. Further, the electronic apparatus 300 has an optical system (lens etc.) 320 which guides incident light (forms a subject image) into a pixel region of this CMOS image sensor 310. The electronic apparatus 300 has a signal processing circuit (PRC) 330 for processing the output signals of the CMOS image sensor 310.

The signal processing circuit 330 applies predetermined signal processing with respect to the output signals of the CMOS image sensor 310. The image signal processed in the signal processing circuit 330 can be projected as a moving image onto a monitor formed by a liquid crystal display or the like or can be output to a printer. Further, it can be directly recorded in a recording medium such as a memory card. Various embodiments are possible.

As explained above, by mounting the solid-state imaging devices 10, 10A, 10B, and 10C explained before as the COS image sensors 310, it becomes possible to provide high performance, small-sized, and low cost camera systems. Further, it is possible to realize for example monitoring cameras or cameras for medical endoscopes or other electronic apparatuses which are used for applications where there are restrictions in mounting size, number of connectable cables, cable length, installation height, etc. in requirements for camera installation.

What is claimed is:

1. A solid-state imaging device, comprising
a pixel part in which pixels are arranged, each pixel including a photoelectric converting and reading part and a signal holding part and
a reading part which reads out pixel signals from the pixel part, wherein
each pixel includes
a photoelectric conversion element which accumulates a charge generated by photoelectric conversion in an integration period,
a transfer element capable of transferring the charge accumulated in the photoelectric conversion element in a transfer period after the integration period,
an output node to which the charge accumulated in the photoelectric conversion element is transferred through the transfer element,
an output buffer part which converts the charge at the output node to a voltage signal corresponding to a quantity of the charge and outputs the converted voltage signal,
a storage transistor connected to the output node,
a storage capacity element which accumulates the charge at the output node through the storage transistor, and
a reset element which resets the output node to a predetermined potential in a reset period and wherein
the signal holding part can hold
a signal with respect to a voltage signal corresponding to the accumulated charge of the photoelectric conversion element transferred to the output node in the transfer period after the integration period and
a signal with respect to a voltage signal corresponding to at least an overflow charge overflowing from the photoelectric conversion element to the output node in any period among the charges in the photoelectric conversion element and the storage capacity element.

2. The solid-state imaging device according to claim 1, wherein
the pixel signals read out from the pixels are, at least,
pixel signals including a read-out signal and a read-out reset signal read out from the pixels,
the signal holding part in the pixel includes
an input node,
a first signal holding capacitor capable of holding a first read-out reset signal which is output from a read-out node of the photoelectric converting and reading part in the pixel and is input to the input node,
a second signal holding capacitor capable of holding a first read-out signal which is output from the read-out node of the photoelectric converting and reading part in the pixel and is input to the input node, a third signal holding capacitor capable of holding a second read-out reset signal which is output from the read-out node of the photoelectric converting and reading part in the pixel and is input to the input node, a fourth signal holding capacitor capable of holding a second read-out signal which is output from the read-out node of the photoelectric converting and reading part in the pixel and is input to the input node, a first switch element which selectively connects the first signal holding capacitor with the read-out node of the photoelectric converting and reading part, a second switch element which selectively connects the second signal holding capacitor with the read-out node of the photoelectric converting and reading part, a third switch element which selectively connects the third signal holding capacitor with the read-out node of the photoelectric converting and reading part, a fourth switch element which selectively connects the fourth signal holding capacitor with the read-out node of the photoelectric converting and reading part, a first output part which includes a source follower element for outputting the signal held in the first signal holding capacitor in accordance with a holding voltage and selectively outputs the converted signal to the signal line, a second output part which includes a source follower element for outputting the signal held in the second signal holding capacitor in accordance with a holding voltage and selectively outputs the converted signal to the signal line, a third output part which includes a source follower element for outputting the signal held in the third signal holding capacitor in accordance with a holding voltage and selectively outputs the converted signal to the signal line, and a fourth output part which includes a source follower element for outputting the signal held in the fourth signal holding capacitor in accordance with a holding voltage and selectively outputs the converted signal to the signal line.

3. The solid-state imaging device according to claim 2, wherein
when reading out the pixel signals in the pixels,
the reading part
reads out the first read-out reset signal as the pixel signal from the photoelectric converting and reading part at the time when the charge does not overflow, and renders the first switch element in the signal holding part conductive for a predetermined time period to cause the first signal holding capacitor to hold the read-out reset signal,
reads out the first read-out signal as the pixel signal from the photoelectric converting and reading part, and renders the second switch element in the signal holding part conductive for a predetermined time period to cause the second signal holding capacitor to hold the read-out signal,
reads out the second read-out signal as the pixel signal from the photoelectric converting and reading part when the charge overflows, and renders the fourth switch element in the signal holding part conductive for a predetermined time period to cause the fourth signal holding capacitor to hold the read-out signal, and
reads out the second read-out reset signal as the pixel signal from the photoelectric converting and reading part, and renders the third switch element in the signal holding part conductive for a predetermined time period to cause the third signal holding capacitor to hold the read-out reset signal.

4. The solid-state imaging device according to claim 2, wherein:
in the signal holding part, a buffer amplifier having a comparison function with a reference voltage is connected between the input node and the first switch element, the second switch element, the third switch element, and the fourth switch element.

5. The solid-state imaging device according to claim 1, wherein
the device includes
a first substrate and
a second substrate,
the first substrate and the second substrate have a stacked structure where these substrates are connected through a connection part,
at least a portion of the photoelectric converting and reading part in the pixel is formed on the first substrate, and
at least the signal holding part, a signal line, and at least a portion of the reading part are formed on the second substrate.

6. The solid-state imaging device according to claim 1, wherein
the signal holding part includes
a comparator which performs comparison processing for comparing the voltage signal from the output buffer part and a reference voltage and outputting a digitalized comparison result signal, and
a memory part which stores data corresponding to the comparison result signal of the comparator, wherein
the comparator, under the control of the reading part, can perform first comparison processing for outputting a digitalized first comparison result signal with respect to a voltage signal obtained by sampling in accordance with the overflow charge overflowing from the photoelectric conversion element to the output node in the integration period.

7. The solid-state imaging device according to claim 6, wherein
the comparator, under the control of the reading part, can perform second comparison processing for outputting a digitalized second comparison result signal with respect to a voltage signal corresponding to the accumulated charge of the photoelectric conversion element transferred to the output node in the transfer period after the integration period.

8. The solid-state imaging device according to claim 7, wherein
in the first comparison processing, the reading part obtains the digitalized first comparison result signal with respect to a voltage signal obtained by sampling of levels of the output node while rendering the storage transistor in a conductive state, before the reading part performs the second comparison processing.

9. The solid-state imaging device according to claim 6, wherein
the reading part samples levels of the output node in accordance with a light intensity in parallel to any integration period.

10. The solid-state imaging device according to claim 9, wherein
the reading part takes a signal in course of the integration period.

11. The solid-state imaging device according to claim 9, wherein
the reading part samples levels of the output node in accordance with the light intensity while changing the reference voltage throughout the integration period.

12. The solid-state imaging device according to claim 6, wherein
in the first comparison processing, the comparator outputs the first comparison result signal corresponding to time in accordance with a quantity of the overflow charge.

13. The solid-state imaging device according to claim 12, wherein
in the first comparison processing, the comparator can cope with light levels from a signal level of the photoelectric conversion element at a maximum sampling time at which the overflow charge begins to overflow from the photoelectric conversion element to the output node up to a signal level obtained at a minimum sampling time.

14. The solid-state imaging device according to claim 7, wherein:
the integration period is a period from when the photoelectric conversion element and the output node are reset to a reset level up to when the transfer element is switched to a conductive state and the transfer period is started,
a period of the first comparison processing is a period from when the photoelectric conversion element and the output node are reset to the reset level up to when the output node is reset to the reset level before the transfer period is started, and
a period of the second comparison processing is a period after the output node is reset to the reset level and is a period including a period after the transfer period.

15. The solid-state imaging device according to claim 6, wherein
each pixel includes
a floating diffusion as the output node and
a reset element which resets the floating diffusion to a predetermined potential in the reset period, and
the output buffer part includes
a source follower element for converting the charge in the floating diffusion to a voltage signal corresponding to the quantity of the charge and outputting the converted signal and
a current source connected to a source of the source follower element.

16. The solid-state imaging device according to claim 6, further including a bypass part which directly connects the storage capacity element to a read-out node side in the integration period.

17. The solid-state imaging device according to claim 6, wherein:
the device includes
a first substrate and
a second substrate,
the first substrate and the second substrate have a stacked structure where these substrates are connected through a connection part,
at least the photoelectric conversion element, the transfer element, the output node, and the output buffer part of the pixel are formed on the first substrate, and
at least the comparator, the memory part, and at least a portion of the reading part are formed on the second substrate.

18. The solid-state imaging device according to claim 17, wherein
each pixel includes
a floating diffusion as the output node and
a reset element which resets the floating diffusion to a predetermined potential in the reset period,
the output buffer part includes
a source follower element which converts the charge in the floating diffusion to a voltage signal corresponding to the quantity of the charge and outputs the converted signal and
a current source connected to a source of the source follower element,
the floating diffusion, the reset element, and the source follower element are formed on the first substrate, and
the current source is formed on the first substrate or the second substrate.

19. A method for driving a solid-state imaging device having
a pixel part in which pixels are arranged, each pixel including a photoelectric converting and reading part and a signal holding part and
a reading part which reads out pixel signals from the pixel part, wherein
each pixel includes
a photoelectric conversion element which accumulates a charge generated by photoelectric conversion in an integration period,
a transfer element capable of transferring the charge accumulated in the photoelectric conversion element in a transfer period after the integration period,
an output node to which the charge accumulated in the photoelectric conversion element is transferred through the transfer element,
an output buffer part which converts the charge at the output node to a voltage signal corresponding to a quantity of the charge and outputs the converted voltage signal,
a storage transistor connected to the output node,
a storage capacity element which accumulates the charge at the output node through the storage transistor, and
a reset element which resets the output node to a predetermined potential in a reset period and wherein
the signal holding part can hold
a signal with respect to a voltage signal corresponding to the accumulated charge of the photoelectric conversion element transferred to the output node in the transfer period after the integration period and a signal with respect to a voltage signal corresponding to at least an overflow charge overflowing from the photoelectric conversion element to the output node in any period among the charges in the photoelectric conversion element and the storage capacity element,
the method for driving a solid-state imaging device comprising:
when reading out pixel signals of the pixels,
under control of the reading part,
performing first comparison processing for outputting a digitalized first comparison result signal with respect to a voltage signal corresponding to the overflow charge overflowing from the photoelectric conversion element to the output node in the integration period and
performing second comparison processing for outputting a digitalized second comparison result signal with respect to a voltage signal corresponding to the accumulated charge of the photoelectric conversion element transferred to the output node in the transfer period after the integration period.

20. An electronic apparatus, comprising a solid-state imaging device and an optical system for forming a subject image in the solid-state imaging device, wherein the solid-state imaging device has a pixel part in which pixels are arranged, each pixel including a photoelectric converting and reading part and a signal holding part and a reading part which reads out pixel signals from the pixel part, wherein each pixel includes a photoelectric conversion element which accumulates a charge generated by photoelectric conversion in an integration period, a transfer element capable of transferring the charge accumulated in the photoelectric conversion element in a transfer period after the integration period, an output node to which the charge accumulated in the photoelectric conversion element is transferred through the transfer element, an output buffer part which converts the charge at the output node to a voltage signal corresponding to a quantity of the charge and outputs the converted voltage signal, a storage transistor connected to the output node, a storage capacity element which accumulates the charge at the output node through the storage transistor, and a reset element which resets the output node to a predetermined potential in a reset period, and wherein the signal holding part can hold a signal with respect to a voltage signal corresponding to the accumulated charge of the photoelectric conversion element transferred to the output node in the transfer period after the integration period and a signal with respect to a voltage signal corresponding to at least an overflow charge overflowing from the photoelectric conversion element to the output node in any period among the charges in the photoelectric conversion element and in the storage capacity element.

* * * * *